(12) United States Patent
Kawanami et al.

(10) Patent No.: US 11,637,532 B2
(45) Date of Patent: Apr. 25, 2023

(54) AMPLIFIER CIRCUIT

(71) Applicant: Murata Manufacturing Co., Ltd., Kyoto (JP)

(72) Inventors: Takashi Kawanami, Kyoto (JP); Makoto Tabei, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 187 days.

(21) Appl. No.: 17/151,805

(22) Filed: Jan. 19, 2021

(65) Prior Publication Data
US 2021/0226587 A1 Jul. 22, 2021

(30) Foreign Application Priority Data
Jan. 22, 2020 (JP) .............................. JP2020-008642

(51) Int. Cl.
*H03F 1/22* (2006.01)
*H03F 1/56* (2006.01)
*H03F 3/195* (2006.01)

(52) U.S. Cl.
CPC ............ *H03F 1/223* (2013.01); *H03F 1/565* (2013.01); *H03F 3/195* (2013.01); *H03F 2200/451* (2013.01)

(58) Field of Classification Search
CPC ..................................... H03F 1/22; H03F 1/12
USPC ............................................ 330/311, 51, 310
See application file for complete search history.

(56) References Cited

U.S. PATENT DOCUMENTS

| | | | |
|---|---|---|---|
| 9,059,665 B2* | 6/2015 | Youssef | H03F 3/16 |
| 10,211,795 B2* | 2/2019 | Wallis | H03F 1/523 |
| 2011/0115572 A1* | 5/2011 | Chan | H03F 3/245 |
| | | | 333/32 |
| 2018/0226367 A1 | 8/2018 | Babcock et al. | |

FOREIGN PATENT DOCUMENTS

JP S6485407 A 3/1989

* cited by examiner

*Primary Examiner* — Henry Choe
(74) *Attorney, Agent, or Firm* — Pearne & Gordon LLP

(57) ABSTRACT

An amplifier circuit includes: a transistor provided between an input terminal and an output terminal and having a gate connected to the input terminal, a source connected to a ground, and a drain connected to the output terminal; an inductor connected between the source and the ground; an inductor connected between the gate and the input terminal, and switches connected to at least one of the inductors and configured to change a mutual inductance of the inductors.

19 Claims, 14 Drawing Sheets

AMPLIFIER CIRCUIT

CROSS REFERENCE TO RELATED APPLICATION

This application claims priority from Japanese Patent Application No. 2020-008642 filed on Jan. 22, 2020. The content of this application is incorporated herein by reference in its entirety.

BACKGROUND

The present disclosure relates to an amplifier circuit.

Hitherto, there has been disclosed an amplifier system capable of improving the linearity of an amplifier by magnetically coupling an inductor connected to a gate of a transistor that is a component of the amplifier to an inductor connected to a source of the transistor to apply negative feedback (see, for example, U.S. Patent Application Publication No. 2018/0226367).

With the amplifier system described in the specification of U.S. Patent Application Publication No. 2018/0226367, high linearity is obtained by strong magnetic coupling of the two inductors; however, a gain decreases because of a large amount of negative feedback. For this reason, when the strength of a radio-frequency signal input to the amplifier is low, a large gain is desired, but the radio-frequency signal is not sufficiently amplified. On the other hand, a gain can be increased by weakening the magnetic coupling of the two inductors; however, the linearity of the amplifier degrades, with the result that a distortion occurs when the strength of a radio-frequency signal input to the amplifier is high.

BRIEF SUMMARY

The present disclosure provides an amplifier circuit capable of providing a gain according to the strength of an input radio-frequency signal while suppressing occurrence of a distortion.

According to embodiments of the present disclosure, an amplifier circuit includes: a first transistor provided between an input terminal to which a radio-frequency signal is input and an output terminal from which a radio-frequency signal is output, and having a first terminal that is a gate or a base connected to the input terminal, a second terminal that is a source or an emitter connected to a ground, and a third terminal that is a drain or a collector connected to the output terminal; a first inductor connected between the second terminal and the ground; a second inductor connected between the first terminal and the input terminal; and one or more switches connected to at least one of the first inductor and the second inductor and configured to change a mutual inductance of the first inductor and the second inductor.

Other features, elements, characteristics and advantages of the present disclosure will become more apparent from the following detailed description of embodiments of the present disclosure with reference to the attached drawings.

DETAILED DESCRIPTION

Figure 1:
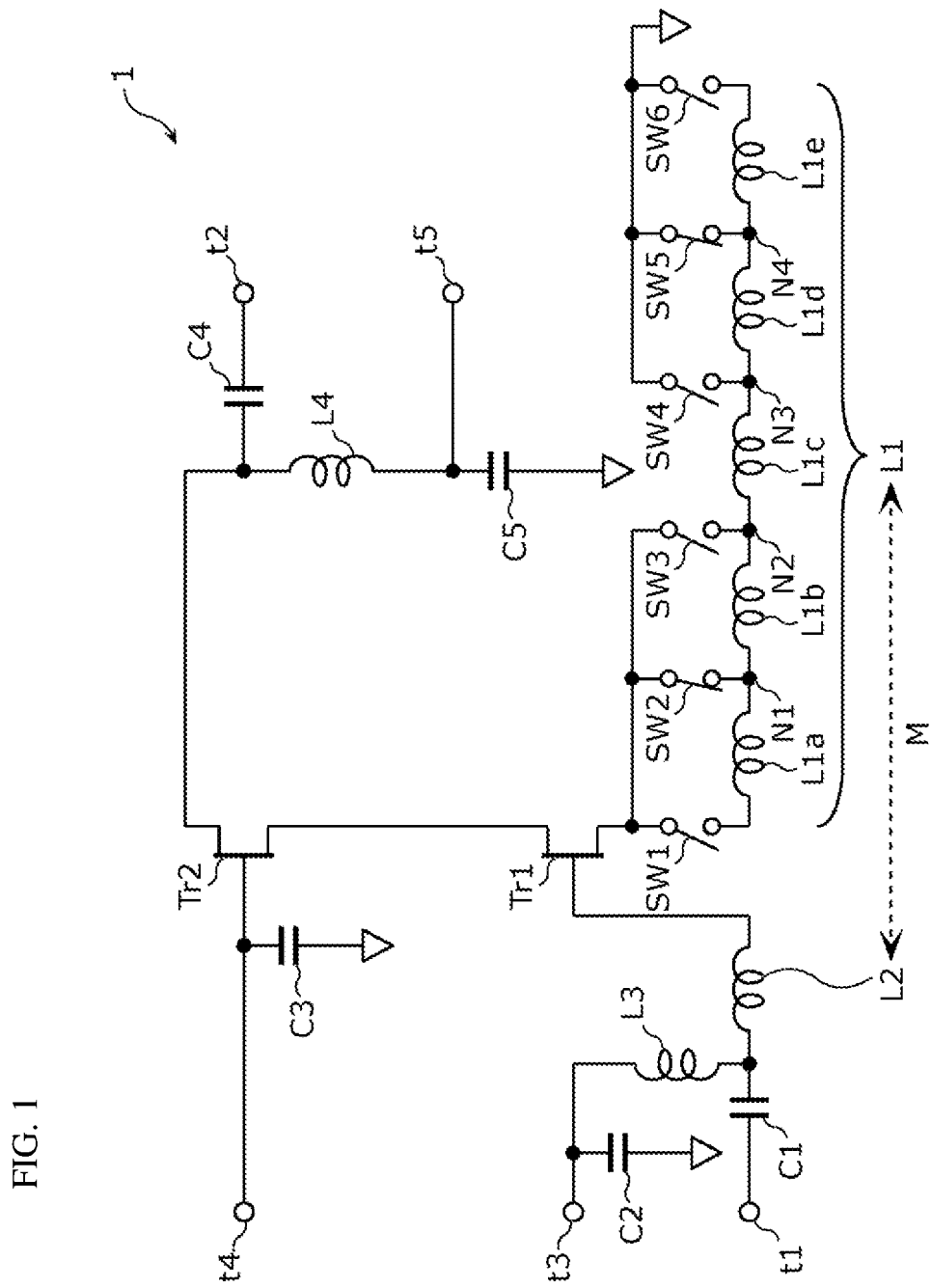
FIG. 1 is a circuit configuration diagram showing an example of an amplifier circuit according to a first embodiment.

Hereinafter, embodiments of the present disclosure will be described in detail with reference to the accompanying drawings. All the embodiments that will be described below are general or specific examples. Numeric values, shapes, materials, elements, disposition and connection modes of the elements, and the like, that will be described below are illustrative, and are not intended to limit the present disclosure. Of the elements in the following embodiments, the elements not included in the independent claims will be described as optional elements. In addition, the size or size ratio of elements shown in the drawings is not necessarily strict. In the drawings, like reference numerals denote substantially identical components, and the overlap description may be omitted or simplified. In the following embodiments, the word "connected" includes not only a directly connected case but also an electrically connected case via another element or the like.

EMBODIMENTS

The embodiments will be described with reference to FIG. 1 to FIG. 14 by way of first to third embodiments.

First Embodiment

FIG. 1 is a circuit configuration diagram showing an example of an amplifier circuit 1 according to the first embodiment.

The amplifier circuit 1 is a circuit that amplifies an input radio-frequency signal and that outputs the radio-frequency signal. An input terminal t1, an output terminal t2, and bias terminals t3, t4, t5 are connected to the amplifier circuit 1. The input terminal t1 is a terminal to which a radio-frequency signal is input. The output terminal t2 is a terminal from which a radio-frequency signal is output. The bias terminals t3, t4, t5 are terminals to which a bias is input.

The amplifier circuit 1 includes transistors Tr1, Tr2, inductors L1, L2, L3, L4, capacitors C1, C2, C3, C4, C5, and one or more switches. The amplifier circuit 1 includes, for example, switches SW1, SW2, SW3, SW4, SW5, SW6 as the one or more switches.

The transistors Tr1, Tr2 are provided between the input terminal t1 to which a radio-frequency signal is input and the output terminal t2 from which a radio-frequency signal is output. The transistor Tr1 is an example of the first transistor. The transistor Tr2 is an example of the second transistor. An amplifier is made up of the transistors Tr1, Tr2. The amplifier is, for example, a low noise amplifier (LNA). Alternatively, the amplifier may be a power amplifier (PA).

The transistor Tr1 has a first terminal that is a gate or a base, a second terminal that is a source or an emitter, and a third terminal that is a drain or a collector. The transistor Tr2 has a fourth terminal that is a gate or a base, a fifth terminal that is a source or an emitter, and a sixth terminal that is a drain or a collector.

The transistors Tr1, Tr2, each is, for example, a metal oxide semiconductor field effect transistor (MOSFET). In this case, the first terminal and the fourth terminal are gates, the second terminal and the fifth terminal are sources, and the third terminal and the sixth terminal are drains.

The gate of the transistor Tr1 is connected to the input terminal t1. Specifically, the gate of the transistor Tr1 is connected to the input terminal t1 via the inductor L2 and the capacitor C1. The gate of the transistor Tr1 is connected to the bias terminal t3 via the inductors L2, L3. The gate of the transistor Tr1 is connected to a ground via the inductors L2, L3 and the capacitor C2. The source of the transistor Tr1 is connected to the ground. Specifically, the source of the transistor Tr1 is connected to the ground via the switches SW1, SW2, SW3, SW4, SW5, SW6 and the inductor L1. The drain of the transistor Tr1 is connected to the output terminal t2. Specifically, the drain of the transistor Tr1 is connected to the output terminal t2 via the transistor Tr2 and the capacitor C4.

The gate of the transistor Tr2 is connected to the bias terminal t4. The gate of the transistor Tr2 is connected to the ground via the capacitor C3. The source of the transistor Tr2 is connected to the drain of the transistor Tr1. The drain of the transistor Tr2 is connected to the output terminal t2 via the capacitor C4. The drain of the transistor Tr2 is connected to the bias terminal t5 via the inductor L4. The drain of the transistor Tr2 is connected to the ground via the inductor L4 and the capacitor C5.

The transistors Tr1, Tr2 are cascode-connected and make up a cascode amplifier.

The switches SW1, SW2, SW3, SW4, SW5, SW6 are connected to at least one of the inductors L1, L2. The switches SW1, SW2, SW3. SW4, SW5, SW6 are connected to, for example, the inductor L1. Each switch is switched between a conductive state and a nonconductive state based on, for example, a control signal from an outside source (for example, a radio-frequency integrated circuit (RFIC)). The switches SW1, SW2, SW3, SW4, SW5, SW6 may be connected to the inductor L2 instead of the inductor L1 or may be connected to the inductor L2 in addition to the inductor L1.

The inductor L1 is a first inductor connected between the source of the transistor Tr1 and the ground. The inductor L1 is a source degeneration inductor for improving the linearity of the transistor Tr1. The at least one inductor (here, the inductor L1) to which the switches SW1, SW2, SW3, SW4, SW5, SW6 are connected includes center taps that divide the inductance component of the inductor into multiple components. For example, the inductor L1 includes the center taps N1, N2, N3, N4. The center taps N1, N2, N3, N4 divide the inductance component of the inductor L1 into inductance components L1$a$, L1$b$, L1$c$, L1$d$, L1$e$. The switches SW1, SW2, SW3, SW4, SW5, SW6 include switches respectively connected to the center taps N1, N2, N3, N4. For example, the switch SW2 is connected to the center tap N1, the switch SW3 is connected to the center tap N2, the switch SW4 is connected to the center tap N3, and the switch SW5 is connected to the center tap N4. Of the inductance components of the inductor L1, inductance components to be enabled are changed by switching each of the switches SW1, SW2, SW3, SW4, SW5, SW6 between a conductive state and a nonconductive state. For example, as shown in FIG. 1, when the switches SW2, SW5 are set in a conductive state and the switches SW1, SW3, SW4, SW6 are set in a nonconductive state, the inductance components L1$b$, L1$c$, L1$d$ of the inductance component of the inductor L1 are enabled.

The inductor L2 is a second inductor connected between the gate of the transistor Tr1 and the input terminal t1. Specifically, the inductor L2 is provided in a path connecting the gate of the transistor Tr1 and the input terminal t1. The inductor L2 makes up an input matching circuit for matching the input impedance of the transistor Tr1.

The inductor L3 is connected between the ground and a node in the path connecting the gate of the transistor Tr1 and the input terminal t1. The inductor L3 makes up an input matching circuit for matching the input impedance of the transistor Tr1. The inductor L3 is connected to the bias terminal t3 and also functions as a bias circuit that adjusts a bias supplied to the transistor Tr1.

The inductor L4 is connected between the ground and a node in a path connecting the drain of the transistor Tr2 and the output terminal t2. The inductor L4 makes up an output matching circuit for matching the output impedance of the transistor Tr2.

The capacitor C1 is provided in the path connecting the gate of the transistor Tr1 and the input terminal t1 and is connected in series with the inductor L2. The capacitor C1 functions as a DC cut capacitor that blocks a bias input to the bias terminal t3 from leaking to the input terminal t1.

The capacitor C2 is connected between the ground and a node in the path connecting the gate of the transistor Tr1 and the input terminal t1. The inductor L3 is inserted in series between the capacitor C2 and the gate of the transistor Tr1. The bias terminal t3 is connected to a node in a path connecting the inductor L3 and the capacitor C2. The capacitor C2 functions as a bypass capacitor and may make up at least part of an input matching circuit for matching the input impedance of the transistor Tr1.

The capacitor C3 is a bypass capacitor connected between the ground and a node in a path connecting the gate of the transistor Tr2 and the bias terminal t3.

The capacitor C4 is provided in the path connecting the drain of the transistor Tr2 and the output terminal t2. The capacitor C4 makes up an output matching circuit for matching the output impedance of the transistor Tr2. The capacitor C4 also functions as a DC cut capacitor that blocks a bias input to the bias terminal t5 from leaking to the output terminal t2.

The capacitor C5 is connected between the ground and a node in the path connecting the drain of the transistor Tr2 and the output terminal t2 and is connected in series with the inductor L4. The bias terminal t5 is connected to a node in a path connecting the inductor L4 and the capacitor C5. The capacitor C5 makes up an output matching circuit for matching the output impedance of the transistor Tr2. The capacitor C5 also functions as a bypass capacitor.

It is possible to adjust the frequency band of a radio-frequency signal to be amplified by the amplifier by adjusting parameters of the matching circuits.

The inductor L1 and the inductor L2 are magnetically coupled. The fact that the inductor L1 and the inductor L2 are magnetically coupled is schematically represented by the dashed arrow in FIG. 1. A mutual inductance of the inductor L1 and the inductor L2 is denoted by "M". When the inductors L1, L2 are magnetically coupled, parameters of the inductors L1, L2 are adjusted such that negative feedback is applied in a specific frequency band.

The mutual inductance M of the inductor L1 and the inductor L2 is changed by switching each of the switches SW1, SW2, SW3, SW4, SW5, SW6 between a conductive state and a nonconductive state. For example, each of the switches SW1, SW2, SW3, SW4, SW5, SW6 is switched between a conductive state and a nonconductive state in accordance with the strength of a radio-frequency signal input to the input terminal t1. Thus, the mutual inductance of the inductor L1 and the inductor L2 is changed. Specifically, each of the switches SW1, SW2, SW3, SW4, SW5, SW6 is controlled between a conductive state and a nonconductive state such that the mutual inductance M increases as the strength of a radio-frequency signal input to the input terminal t1 increases, in other words, the mutual inductance M reduces as the strength of a radio-frequency signal input to the input terminal t1 decreases.

The connection relation among the center taps N1, N2, N3, N4 and the switches SW2, SW3, SW4, SW5 is not limited to the one shown in FIG. 1 and is not limited. Here, another example of the connection relation among the center taps N1, N2, N3, N4 and the switches SW2, SW3, SW4, SW5 will be described with reference to FIG. 2 and FIG. 3.

Figure 2:
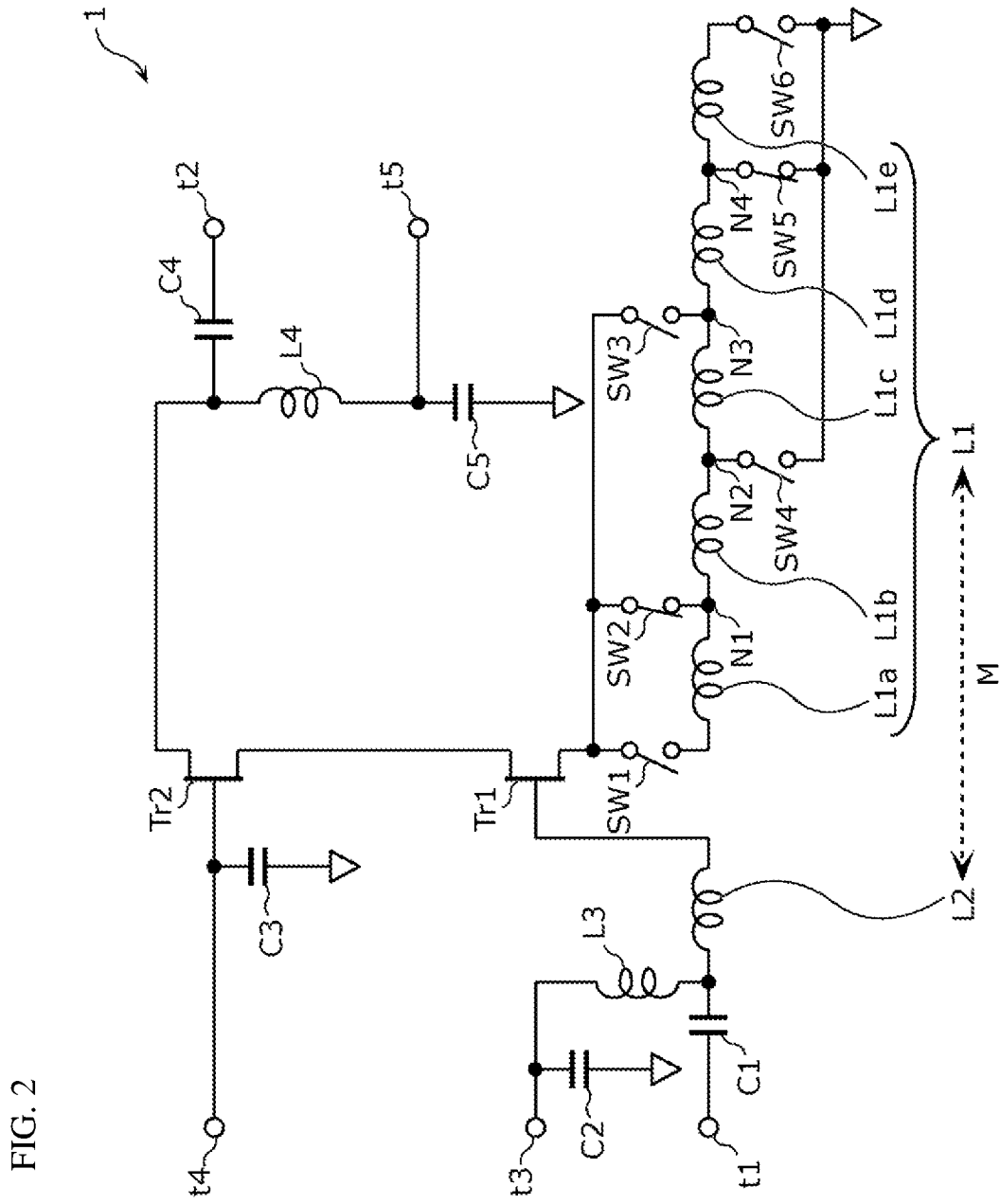
FIG. 2 is a circuit configuration diagram showing another example of an amplifier circuit according to the first embodiment.
Figure 3:
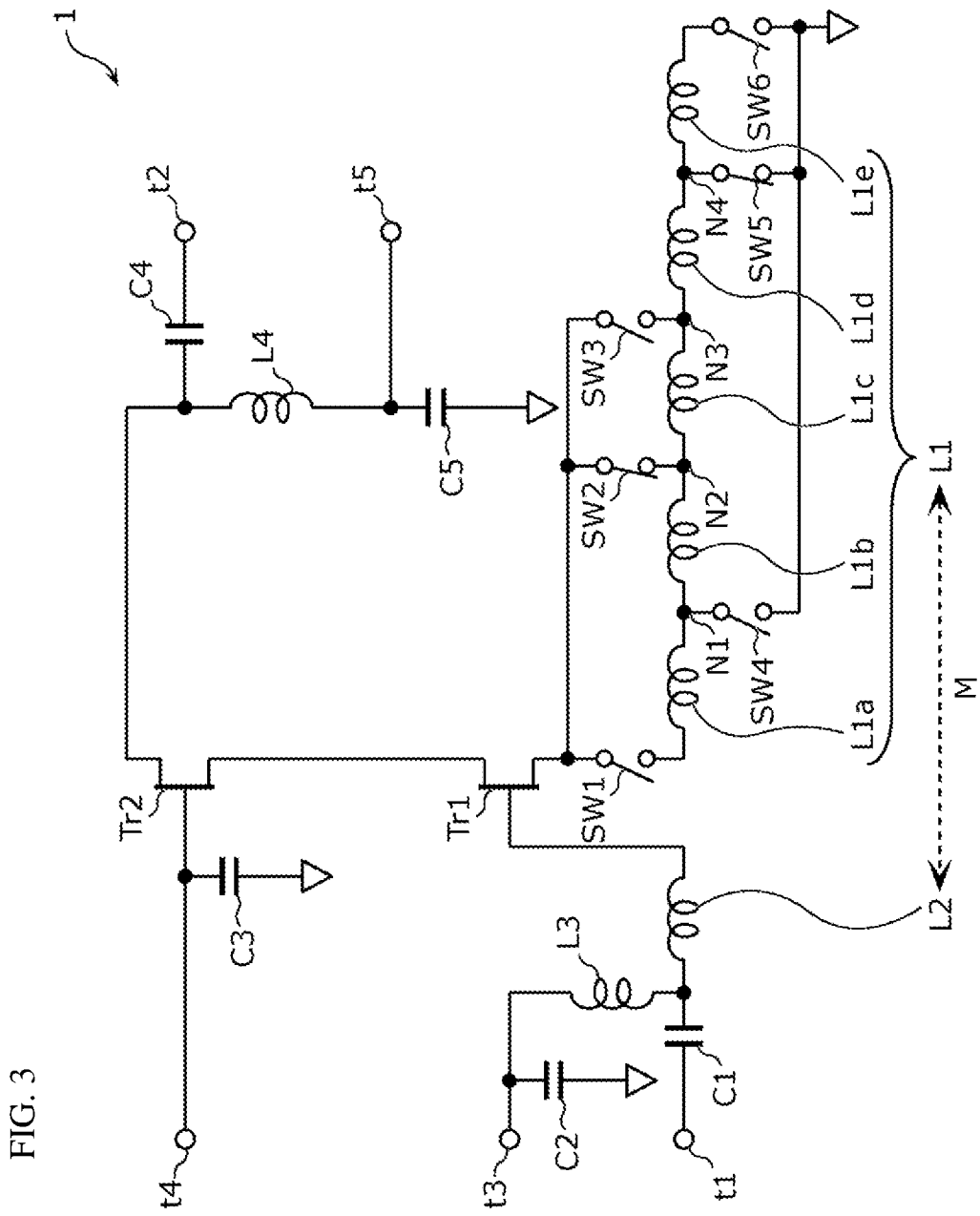
FIG. 3 is a circuit configuration diagram showing another example of an amplifier circuit according to the first embodiment.

FIG. 2 and FIG. 3 are circuit configuration diagrams showing other examples of the amplifier circuit according to the first embodiment.

For example, as shown in FIG. 2, the switch SW2 may be connected to the center tap N1, the switch SW4 may be connected to the center tap N2, the switch SW3 may be connected to the center tap N3, and the switch SW5 may be connected to the center tap N4. Alternatively, for example, as shown in FIG. 3, the switch SW4 may be connected to the center tap N1, the switch SW2 may be connected to the center tap N2, the switch SW3 may be connected to the center tap N3, and the switch SW5 may be connected to the center tap N4.

A method of changing the mutual inductance M may be a method of changing a distance between the inductor L1 and the inductor L2, a method of changing an overlapping area between the inductor L1 and the inductor L2, or a method of changing a permeability between the inductor L1 and the inductor L2.

For example, a distance between the inductor L1 and the inductor L2 may be changed by switching each of the switches SW1, SW2, SW3, SW4, SW5, SW6 between a conductive state and a nonconductive state. When a distance between the inductor L1 and the inductor L2 changes, the degree of magnetic coupling of the inductor L1 and the inductor L2 changes, so the mutual inductance M changes. For example, a distance between the inductor L2 and a portion corresponding to each of the inductance components L1a, L1b, L1c, L1d, L1e in the inductor L1 is varied in advance. With this configuration, of the inductance components L1a, L1b, L1c, L1d, L1e in the inductor L1, inductance components to be enabled are changed. Thus, a distance between the inductor L2 and a portion corresponding to effective inductance components in the inductor L1 can be changed. An example of the shape and the like of each of the inductors L1, L2 in the case of using the method will be described with reference to FIG. 4 and FIG. 5.

Figure 4:
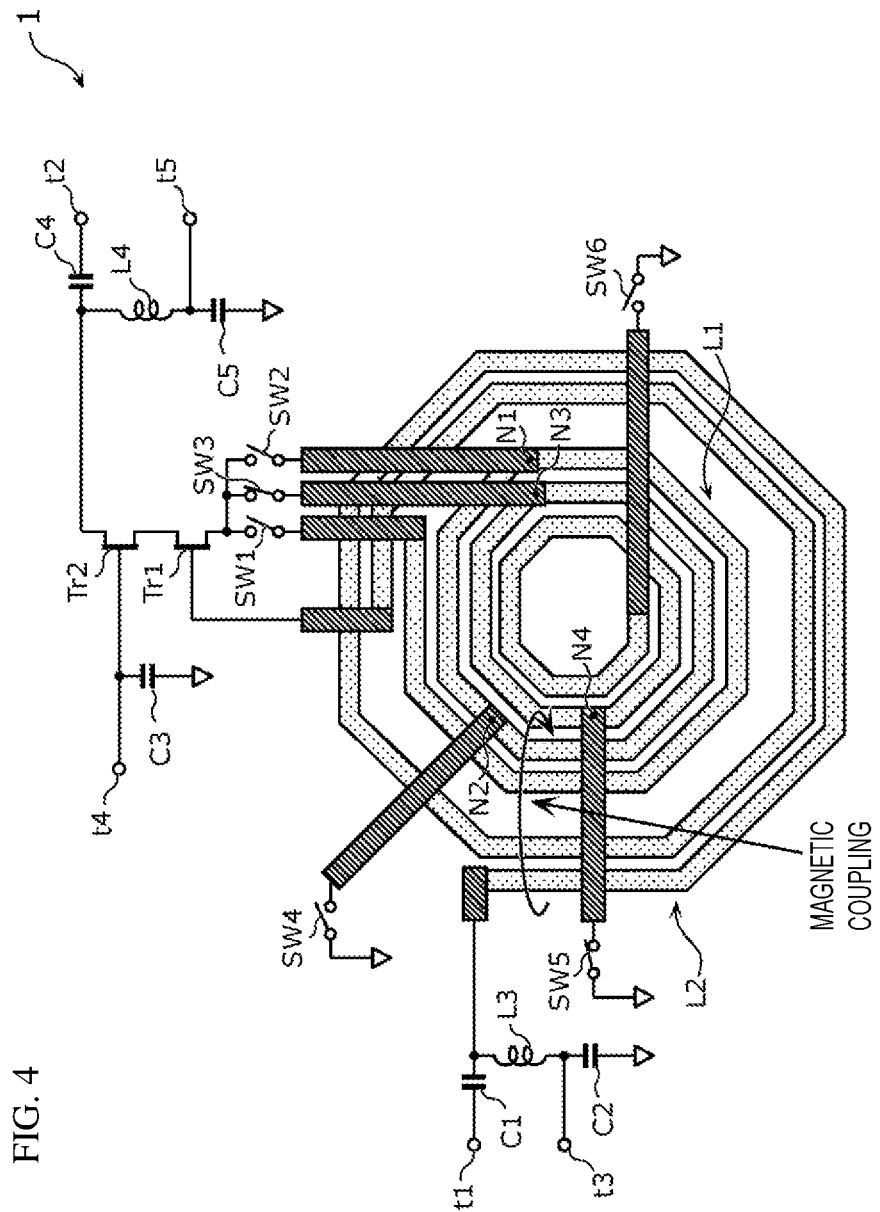
FIG. 4 is a diagram for illustrating a first example of the shape and the like of each inductor in the amplifier circuit according to the first embodiment.

FIG. 4 is a diagram for illustrating a first example of the shape and the like of each of the inductors L1, L2 in the amplifier circuit 1 according to the first embodiment. In FIG. 4, the connection relation among the center taps N1, N2, N3, N4 and the switches SW2, SW3, SW4, SW5 is the one shown in FIG. 2.

Figure 5:
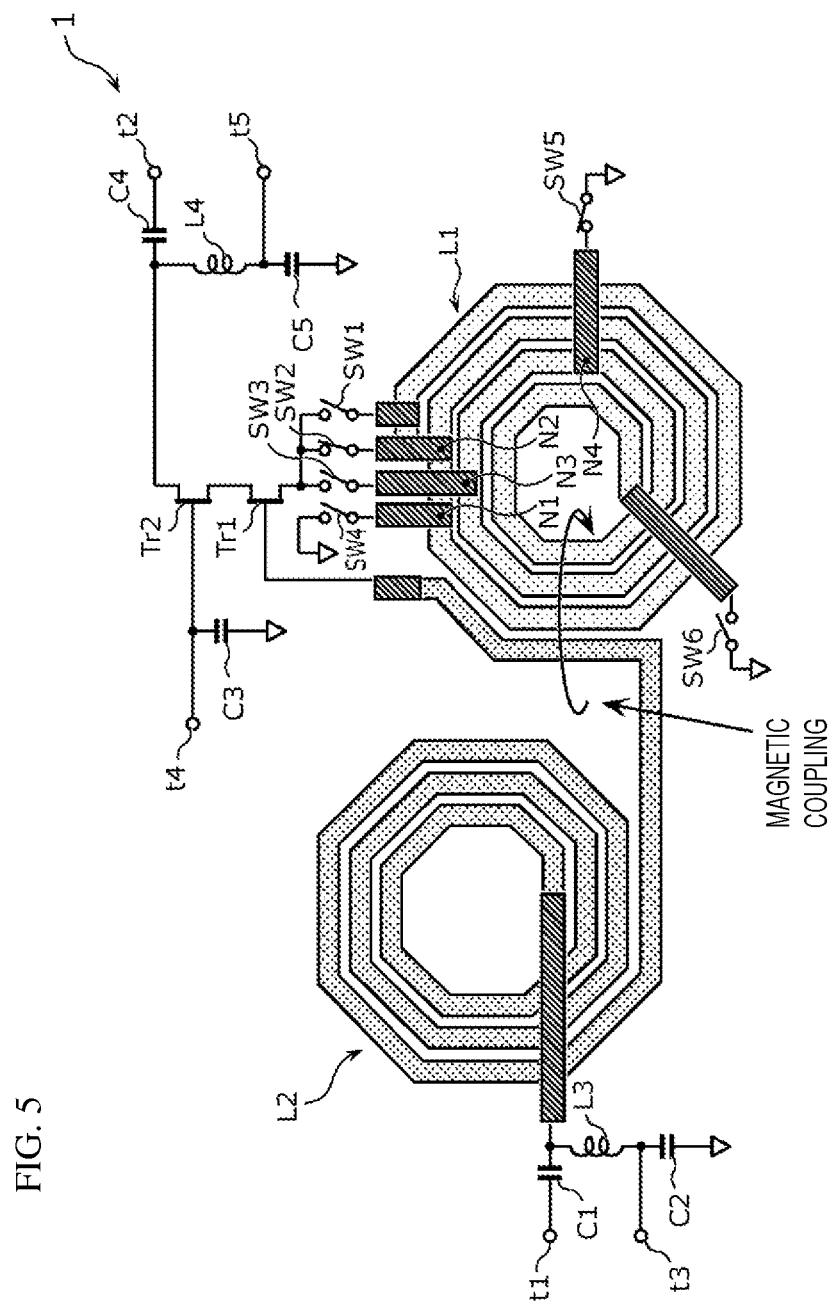
FIG. 5 is a diagram for illustrating a second example of the shape and the like of each inductor in the amplifier circuit according to the first embodiment.

FIG. 5 is a diagram for illustrating a second example of the shape and the like of each of the inductors L1, L2 in the amplifier circuit 1 according to the first embodiment. In FIG. 5, the connection relation among the center taps N1, N2, N3, N4 and the switches SW2, SW3, SW4, SW5 is the one shown in FIG. 3.

For example, as shown in FIG. 4, when the inductors L1, L2 are shown in plan view, the inductors L1, L2 are spiral inductors and may be provided concentrically in the plan view. Here, the inductors, L1, L2 are provided concentrically such that the inductor L2 surrounds the inductor L1. An inner-side (spiral center-side) conductor of the inductor L2 and an outer-side (spiral outer peripheral-side) conductor of the inductor L2 are disposed in proximity to each other. Thus, the inductor L1 and the inductor L2 are magnetically coupled.

In FIG. 2 and FIG. 4, when, for example, the switches SW1, SW4 are in a conductive state and the switches SW2, SW3, SW5, SW6 are in a nonconductive state, an inductance component from one end (specifically, outer-side end) to the portion where the center tap N2 is provided within a conductor making up the inductor L1 (that is, the inductance components L1a, L1b) is enabled. When, for example, the switches SW2, SW5 are in a conductive state and the switches SW1, SW3, SW4, SW6 are in a nonconductive state, an inductance component from the portion where the center tap N1 is provided to the portion where the center tap N4 is provided within the conductor making up the inductor L1 (that is, the inductance components L1b, L1c, L1d) is enabled. When, for example, the switches SW3, SW6 are in a conductive state and the switches SW1, SW2, SW4, SW5 are in a nonconductive state, an inductance component from the portion where the center tap N3 is provided to the other end (specifically, inner-side end) within the conductor making up the inductor L1 (that is, the inductance components L1d, L1e) is enabled.

For example, as shown in FIG. 5, when the inductors L1, L2 are shown in plan view, the inductors L1, L2 are spiral inductors and may be provided such that the inductor L1 and the inductor L2 do not overlap each other in the plan view. Here, the inductor L1 and the inductor L2 are next to each other so as not to overlap each other. Part of the outer side portion of the inductor L1 and part of the outer side portion of the inductor L2 are disposed in proximity to each other. Thus, the inductor L1 and the inductor L2 are magnetically coupled.

In FIG. 3 and FIG. 5, when, for example, the switches SW1, SW4 are in a conductive state and the switches SW2, SW3, SW5, SW6 are in a nonconductive state, an inductance component from one end (specifically, outer-side end) to the portion where the center tap N1 is provided within the conductor making up the inductor L1 (that is, the inductance component L1a) is enabled. When, for example, the switches SW2, SW5 are in a conductive state and the switches SW1, SW3, SW4, SW6 are in a nonconductive state, an inductance component from the portion where the center tap N2 is provided to the portion where the center tap N4 is provided within the conductor making up the inductor L1 (that is, the inductance components L1c, L1d) is enabled. When, for example, the switches SW3, SW6 are in a conductive state and the switches SW1, SW2, SW4, SW5 are in a nonconductive state, an inductance component from the portion where the center tap N3 is provided to the other end (specifically, inner-side end) within the conductor making up the inductor L1 (that is, the inductance components L1d, L1e) is enabled.

For example, a state where the switches SW3, SW6 are in a conductive state and the switches SW1, SW2, SW4, SW5 are in a nonconductive state is referred to as first state, a state where the switches SW2, SW5 are in a conductive state and the switches SW1, SW3, SW4, SW6 are in a nonconductive state is referred to as second state, and a state where the switches SW1, SW4 are in a conductive state and the switches SW2, SW3, SW5, SW6 are in a nonconductive state is referred to as third state.

Of the first state, the second state, and the third state, a distance between the inductor L2 and a portion corresponding to the effective inductance component of the inductor L1 is the longest in the first state, and the distance is the shortest in the third state. In other words, it is possible to reduce the mutual inductance M by setting the switches SW1, SW2, SW3, SW4, SW5, SW6 in the first state, and it is possible to increase the mutual inductance M by setting the switches SW1, SW2, SW3, SW4, SW5, SW6 in the third state.

In this way, it is possible to change the mutual inductance M by changing a distance between the inductor L1 and the inductor L2.

Alternatively, for example, an overlapping area between the inductor L1 and the inductor L2 may be changed by switching each of the switches SW1, SW2, SW3, SW4, SW5, SW6 between a conductive state and a nonconductive state. When an overlapping area between the inductor L1 and the inductor L2 changes, the degree of magnetic coupling of the inductor L1 and the inductor L2 changes, so the mutual inductance M changes. For example, the way of overlapping between the inductor L2 and a portion corresponding to each of the inductance components L1a, L1b, L1c, L1d, L1e in the inductor L1 is varied in advance. With this configuration, of the inductance components L1a, L1b, L1c, L1d, L1e in the inductor L1, inductance components to be enabled are changed. Thus, an overlapping area between the inductor L2 and a portion corresponding to effective inductance components in the inductor L1 can be changed. An example of the shape and the like of each of the inductors L1, L2 in the case of using the method will be described with reference to FIG. 6.

Figure 6:
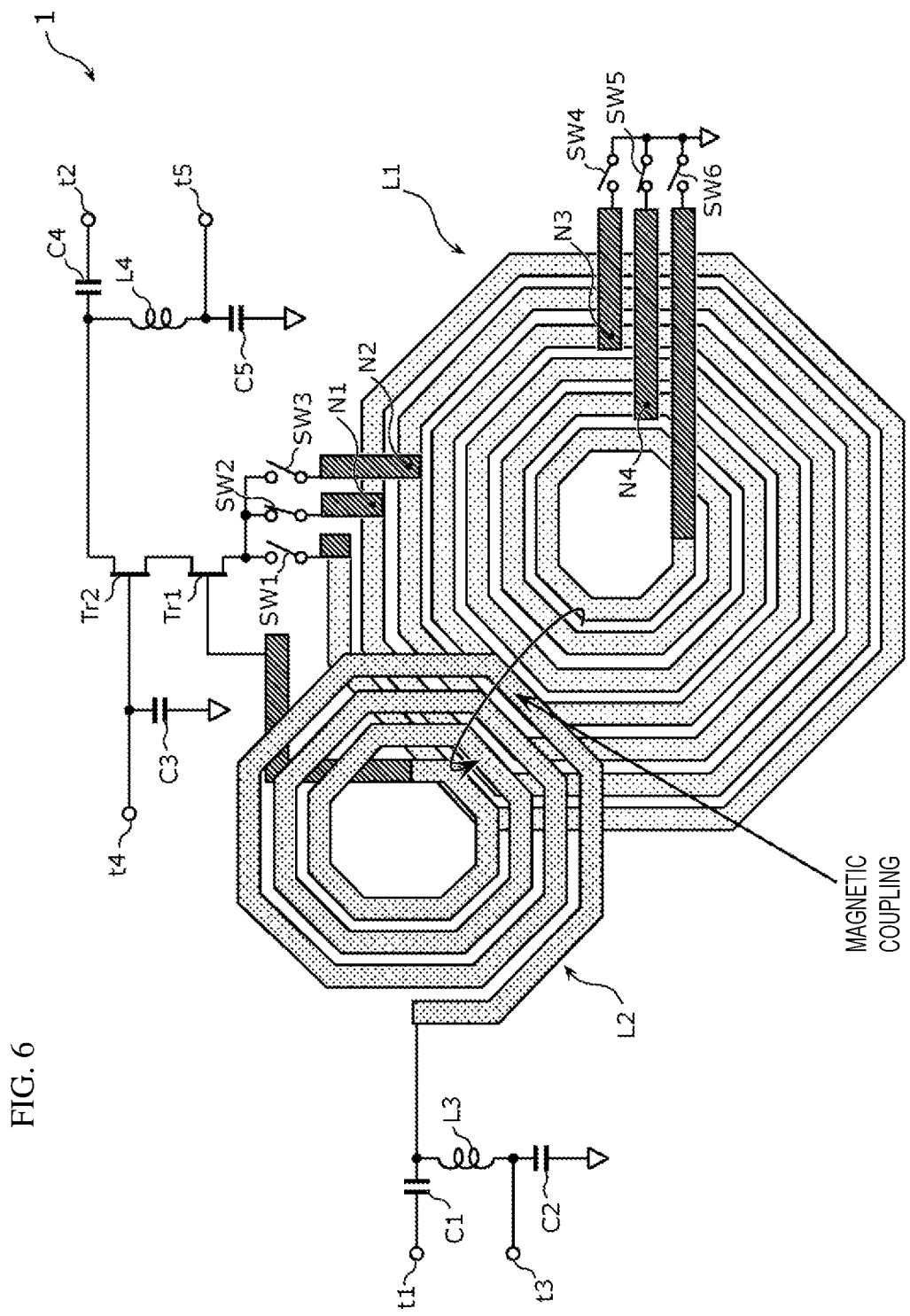
FIG. 6 is a diagram for illustrating a third example of the shape and the like of each inductor in the amplifier circuit according to the first embodiment.

FIG. 6 is a diagram for illustrating a third example of the shape and the like of each of the inductors L1, L2 in the amplifier circuit 1 according to the first embodiment. In FIG. 6, the connection relation among the center taps N1, N2, N3, N4 and the switches SW2, SW3, SW4, SW5 is the one shown in FIG. 1.

For example, as shown in FIG. 6, when the inductors L1, L2 are shown in plan view, the inductors L1, L2 are spiral inductors and may be provided such that at least part of the inductor L1 and at least part of the inductor L2 overlap each other in the plan view. Here, for example, the inductors L1, L2 are respectively formed in different layers in a multilayer board. A multilayer board may be a resin printed circuit board, may be a ceramic dielectric substrate, or may be an IC board made up of a semiconductor and an insulator. The inductor L1 and the inductor L2 are disposed so as to overlap each other in the plan view. Thus, the inductor L1 and the inductor L2 are magnetically coupled.

In FIG. 1 and FIG. 6, when, for example, the switches SW1, SW4 are in a conductive state and the switches SW2, SW3, SW5, SW6 are in a nonconductive state, an inductance component from one end (specifically, outer-side end) to the portion where the center tap N3 is provided within the conductor making up the inductor L1 (that is, the inductance components L1a, L1b, L1c) is enabled. When, for example, the switches SW2, SW5 are in a conductive state and the switches SW1, SW3, SW4, SW6 are in a nonconductive state, an inductance component from the portion where the center tap N1 is provided to the portion where the center tap N4 is provided within the conductor making up the inductor L1 (that is, the inductance components L1b, L1c, L1d) is enabled. When, for example, the switches SW3, SW6 are in a conductive state and the switches SW1, SW2, SW4, SW5 are in a nonconductive state, an inductance component from the portion where the center tap N2 is provided to the other end (specifically, inner-side end) within the conductor making up the inductor L1 (that is, the inductance components L1c, L1d, L1e) is enabled.

Of the first state, the second state, and the third state, an overlapping area between the inductor L2 and a portion corresponding to the effective inductance component of the inductor L1 is the smallest in the first state, and the overlapping area is the largest in the third state. In other words, it is possible to reduce the mutual inductance M by setting the switches SW1, SW2, SW3, SW4, SW5, SW6 in the first state, and it is possible to increase the mutual inductance M by setting the switches SW1, SW2, SW3, SW4, SW5, SW6 in the third state.

In this way, it is possible to change the mutual inductance M by changing an overlapping area between the inductor L1 and the inductor L2.

Alternatively, for example, a permeability between the inductor L1 and the inductor L2 may be changed by switching each of the switches SW1, SW2, SW3, SW4, SW5, SW6 between a conductive state and a nonconductive state. When a permeability between the inductor L1 and the inductor L2 changes, the degree of magnetic coupling of the inductor L1 and the inductor L2 changes, so the mutual inductance M changes. For example, the permeability of a magnetic material around a portion corresponding to each of the inductance components L1a, L1b, L1c, L1d, L1e in the inductor L1 is varied in advance. With this configuration, of the inductance components L1a, L1b, L1c, L1d, L1e in the inductor L1, inductance components to be enabled are changed. Thus, a permeability between the inductor L2 and a portion corresponding to effective inductance components in the inductor L1 can be changed. An example of the shape and the like of each of the inductors L1, L2 in the case of using the method will be described with reference to FIG. 7.

Figure 7:
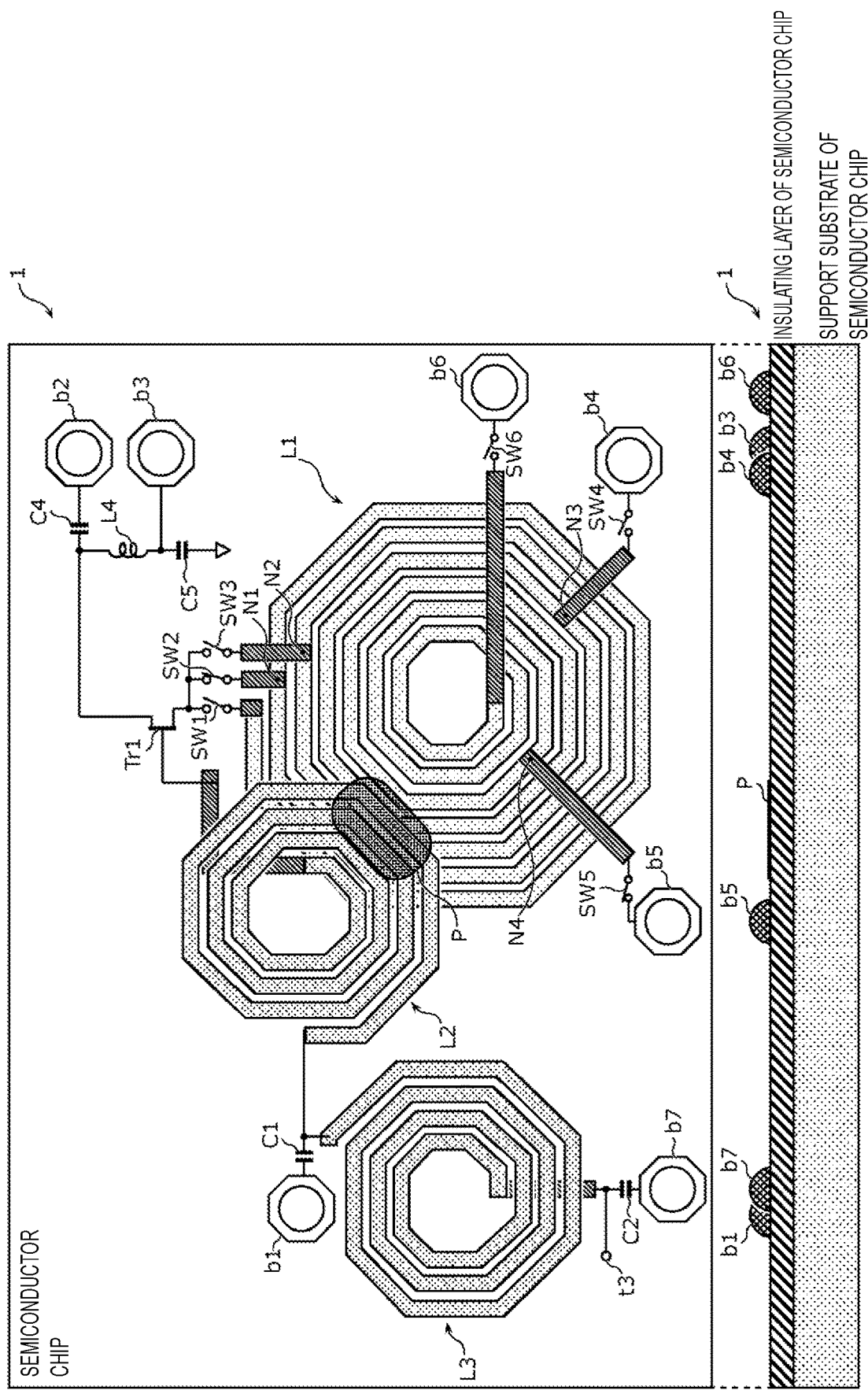
FIG. 7 is a diagram for illustrating a fourth example of the shape and the like of each inductor in the amplifier circuit according to the first embodiment.

FIG. 7 is a diagram for illustrating a fourth example of the shape and the like of each of the inductors L1, L2 in the amplifier circuit 1 according to the first embodiment. In FIG. 7, the connection relation among the center taps N1, N2, N3, N4 and the switches SW2, SW3, SW4, SW5 is the one shown in FIG. 1. In the fourth example, not cascode amplification but common-source amplification may be used for the amplifier circuit 1. FIG. 7 shows an example of common-source amplification. FIG. 7 schematically shows a semiconductor chip on or in which the amplifier circuit 1 is formed. A plan view of the semiconductor chip is shown at the top of FIG. 7, and a side view of the semiconductor chip is shown at the bottom of FIG. 7. In FIG. 7, a patch P is disposed on some area between the inductor L1 and the inductor L2. The input terminal t1 is represented by a solder bump b1, the output terminal t2 is represented by a solder bump b2, the bias terminal t5 is represented by a solder bump b3, a ground to which the switch SW4 is connected is represented by a solder bump b4, a ground to which the switch SW5 is connected is represented by a solder bump b5, a ground to which the switch SW6 is connected is represented by a solder bump b6, and a ground to which the capacitor C2 is connected is represented by a solder bump b7.

Since inductance components that are enabled when each switch is switched between a conductive state and a non-conductive state in FIG. 7 are the same as those described in FIG. 6, the description thereof is omitted.

The patch P is formed by sputtering N1-Zn (nickel-zinc) ferrite thin film. The patch P is disposed on some area between the inductor L1 and the inductor L2 and is not disposed on another area. With this configuration, it is possible to partially vary the permeability, so it is possible to change the permeability between the inductor L1 and the inductor L2 by changing the inductance components to be enabled.

In this way, it is possible to change the mutual inductance M by changing a permeability between the inductor L1 and the inductor L2.

In the embodiment of FIG. 7, with the effect of an increase in self-induction and/or mutual induction resulting from an increase in permeability, caused by a magnetic thin film, inductors are reduced in size in a band of about 500 MHz to about 800 MHz in which the size of inductors tends to increase. The reason why not cascode amplification but common-source amplification is used in the embodiment of FIG. 7 is that a sufficient gain is easily obtained even with common-source amplification in a relatively low frequency band, such as a band of about 500 MHz to about 800 MHz.

Figure 8:
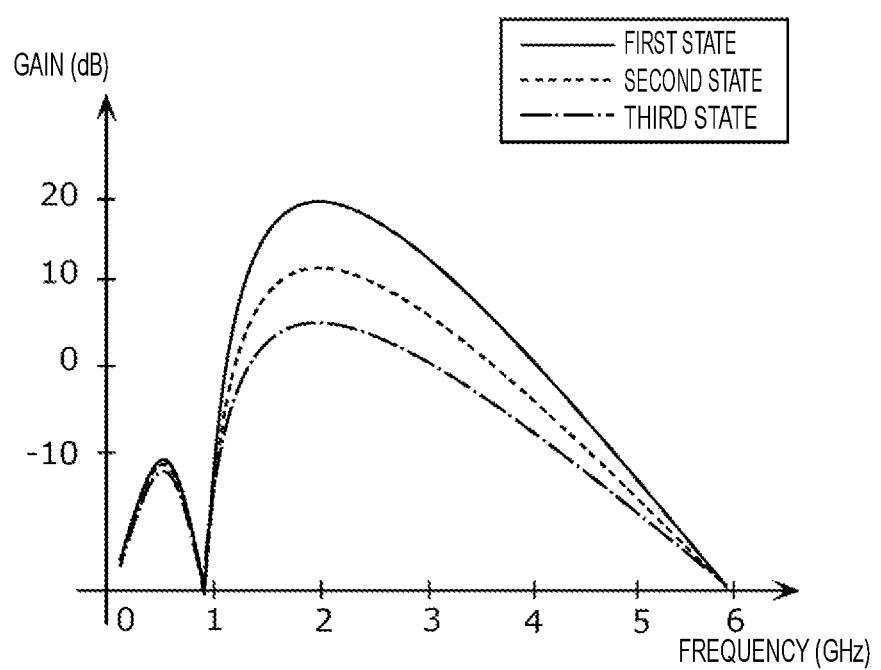
FIG. 8 is a graph showing the frequency characteristics of a gain in each state of the switches.

The switches SW1, SW2, SW3, SW4, SW5, SW6 may change the mutual inductance M while substantially maintaining the self-inductance of the inductor L1. Specifically, for example, the inductance value of each of the inductance components L1a, L1b, L1c, L1d, L1e in the inductor L1 may be adjusted such that the self-inductance of the inductor L1 in the first state, the self-inductance of the inductor L1 in the second state, and the self-inductance of the inductor L1 in the third state are substantially the same. In this case, it is possible to change the mutual inductance M while substantially maintaining the self-inductance of the inductor L1. The term "substantially maintaining" means not only not changing the self-inductance at all but also a state where the self-inductance unintentionally fluctuates within the range of about plus and minus 30%. Such fluctuations are allowed when the frequency characteristics of the amplifier are somewhat broad as shown in FIG. 8 (described later). Generally, it is possible to provide the broad frequency characteristics of an amplifier with negative feedback, so it is possible to perform such a design that fluctuations in the self-inductance of an inductor connected to an amplifier are allowed to a certain degree.

Alternatively, the switches SW1, SW2, SW3, SW4, SW5, SW6 may change the mutual inductance M while changing the self-inductance of the inductor L1.

Specifically, for example, it is assumed that, when the connection relation among the center taps N1, N2, N3, N4 and the switches SW2, SW3, SW4, SW5 is the one shown in FIG. 2, the inductance components L1a, L1b, L1c, L1d, L1e in the inductor L1 have substantially the same inductance value. In this case, the switches SW1, SW2, SW3, SW4, SW5, SW6 are switched between the second state and the first state or switched between the second state and the third state.

Alternatively, for example, the inductance components L1a, L1b, L1c, L1d, L1e in the inductor L1 respectively have different inductance values, and then inductance components to be enabled are changed.

With this configuration, it is possible to change the mutual inductance M while changing the self-inductance of the inductor L1. It is possible to optimize impedance matching or optimize noise figure (NF) by changing the self-inductance of the inductor L1.

The transistors Tr1, Tr2 may be, for example, bipolar transistors. In this case, the first terminal and the fourth terminal are bases, the second terminal and the fifth terminal are emitters, and the third terminal and the sixth terminal are collectors. In the above description and the following description, gates may be replaced with bases, sources may be replaced with emitters, and drains may be replaced with collectors. In a bipolar transistor, the input impedance at the time of common-emitter tends to be lower, so the input matching circuit of the transistor Tr1 may need to be changed as needed.

Advantageous Effects and the Like of First Embodiment

The amplifier circuit 1 includes: the transistor Tr1 provided between the input terminal t1 to which a radio-frequency signal is input and the output terminal t2 from which a radio-frequency signal is output and having the first terminal that is a gate or a base connected to the input terminal t1, the second terminal that is a source or an emitter connected to the ground, and the third terminal that is a drain or a collector connected to the output terminal t2; the inductor L1 connected between the second terminal and the ground, the inductor L2 connected between the first terminal and the input terminal t1; and one or more switches connected to at least one of the inductor L1 and the inductor L2 and configured to change the mutual inductance M of the inductor L1 and the inductor L2.

With this configuration, the mutual inductance M of the inductor L1 and the inductor L2 changes when each of one or more switches connected to at least one of the inductors L1, L2 is switched between a conductive state and a nonconductive state, so it is possible to change the amount of negative feedback. When an input radio-frequency signal is large, a large gain is not needed, so it is possible to increase the amount of negative feedback by increasing the mutual inductance M. In other words, it is possible to suppress occurrence of a distortion by enhancing the linearity of an amplifier made up of the transistor Tr1. When an input radio-frequency signal is small, a distortion is less likely to occur, so it is possible to reduce the amount of negative feedback by reducing the mutual inductance M. In other words, it is possible to amplify a small radio-frequency signal by a large amount by increasing a gain.

For example, the electrical characteristics of the amplifier (for example, the amplifier made up of the transistors Tr1, Tr2) when the state of the switches is set to the first state at the time when the strength of an input radio-frequency signal is a first strength, the electrical characteristics of the amplifier when the state of the switches is set to the second state at the time when the strength of an input radio-frequency signal is a second strength higher than the first strength, and the electrical characteristics of the amplifier when the state of the switches is set to the third state at the time when the strength of an input radio-frequency signal is a third strength higher than the second strength will be described with reference to FIG. 8 and Table 1.

FIG. 8 is a graph showing the frequency characteristics of a gain of the amplifier in each state of the switches.

Table 1 shows electrical characteristics at 2 GHz of the amplifier in each state of the switches. Table 1 shows gain, third order input intercept point (IIP3), NF, degree of magnetic coupling, and degree of the amount of negative feedback as the electrical characteristics of the amplifier.

TABLE 1

| STATE | GAIN | IIP3 | NF | REMARKS 1 | REMARKS 2 |
|---|---|---|---|---|---|
| FIRST STATE | 20 dB | 5 dBm | 1.6 | WEAK MAGNETIC COUPLING | SMALL AMOUNT OF NEGATIVE FEEDBACK |
| SECOND STATE | 11 dB | 10 dBm | 1.8 | MEDIUM MAGNETIC COUPLING | MEDIUM AMOUNT OF NEGATIVE FEEDBACK |
| THIRD STATE | 6 dB | 20 dBm | 1.8 | STRONG MAGNETIC COUPLING | LARGE AMOUNT OF NEGATIVE FEEDBACK |

As shown in Table 1, the degree of magnetic coupling (that is, the mutual inductance M) can be changed by switching the state of the switches. The amount of negative feedback also varies with the degree of magnetic coupling.

As shown in FIG. 8 and Table 1, in the first state where the amount of negative feedback is small, the gain is 20 dB and large, so it is possible to amplify an input radio-frequency signal with a low strength by a large amount. In the third state where the amount of negative feedback is large, the gain is 6 dB and small; however, the strength of a radio-frequency signal input at this time is high, so it is less likely to be problematic. In this way, it is found that a gain varies when the state of the switches is switched.

In addition, as shown in Table 1, in the third state where the amount of negative feedback is large, it is possible to increase the power value of IIP3 to 20 dBm. This means that the linearity gets better as IIP3 increases. Thus, a distortion is less likely to occur in an input radio-frequency signal with a high strength. In the first state of which the amount of negative feedback is small, the power value of IIP3 is 5 dBm and small; however, the strength of an input radio-frequency signal is low, so it is less likely to be problematic.

As shown in Table 1, NF is 1.6 in the first state; whereas NF is 1.8 and has not increased so much in the second state and the third state, so it is possible to suppress an increase in NF even when the amount of negative feedback increases. This is because negative feedback is performed without necessarily using a resistor or the like.

In this way, it is possible to obtain a gain according to the strength of an input radio-frequency signal while suppressing occurrence of a distortion.

For example, the amplifier circuit 1 may include the transistor Tr2 having the fourth terminal that is a gate or a base, the fifth terminal that is a source or an emitter connected to the third terminal, and the sixth terminal that is a drain or a collector connected to the output terminal t2, and the third terminal may be connected to the output terminal t2 via the transistor Tr2.

With this configuration, a gain tends to decrease by the amount by which negative feedback of a radio-frequency signal is performed by the magnetically coupled inductors L1, L2; however, Miller effect is suppressed by the cascode amplifier made up of the transistors Tr1, Tr2 to make it easy to maintain a gain even at radio frequencies, so it is possible to make allowance for a gain.

For example, at least one of the inductors L1, L2 to which one or more switches are connected may be the inductor L1.

When, for example, one or more switches are connected to the inductor L2 connected to the input portion of the amplifier, the equivalent series resistance of the inductor L2 increases, and an insertion loss (IL) increases at the input portion of the amplifier, so NF increases, that is, degrades. In contrast, when one or more switches are connected to not the inductor L2 but the inductor L1, it is possible to suppress degradation of NF.

For example, one or more switches may change the mutual inductance M in accordance with the strength of a radio-frequency signal input to the input terminal t1.

With this configuration, it is possible to automatically adjust the mutual inductance M, that is, the amount of negative feedback, in accordance with the strength of an input radio-frequency signal.

For example, one or more switches may change the mutual inductance M by changing a distance between the inductor L1 and the inductor L2, an overlapping area between the inductor L1 and the inductor L2, or a permeability between the inductor L1 and the inductor L2.

In this way, it is possible to achieve a change of the mutual inductance M by changing a distance between the inductor L1 and the inductor L2, an overlapping area between the inductor L1 and the inductor L2, or a permeability between the inductor L1 and the inductor L2. It is possible to increase self-induction and mutual induction by setting a relative permeability to one or greater, so an advantageous effect of reducing the size of an inductor is also obtained.

For example, one or more switches may change the mutual inductance M while maintaining the self-inductance of at least one inductor (here, the inductor L1).

With this configuration, impedance matching is less likely to deviate when the mutual inductance M is changed.

For example, at least one inductor (here, the inductor L1) may include a center tap that divides the inductance component of the at least one inductor into multiple components, and one or more switches may include a switch connected to the center tap.

With this configuration, it is possible to change inductance components to be enabled of the inductance components in the one inductor L1 by using the switch connected to the center tap. Therefore, in comparison with, for example, the case where a plurality of inductors each having a different distance from the inductor L2, or the like, is prepared and the mutual inductance M is changed by switching among the plurality of inductors, part of each inductor can be shared between each other, so it is possible to reduce the size of the amplifier circuit 1. In addition, an inductance value is increased by self-induction through magnetic coupling of the divided inductance components, and equivalent series resistance is reduced, so it is possible to reduce the size, increase a quality factor value, and suppress losses. Furthermore, it is possible to change the mutual inductance M in minute steps by changing a combination of switches set in a conductive state and switches set in a nonconductive state, of the switches connected to center taps.

When, for example, the inductors L1, L2 are shown in plan view as shown in FIG. 4 to FIG. 6, the inductors L1, L2 may be spiral inductors.

With this configuration, it is possible to obtain a desired inductance or quality factor value by disposing the inductors L1, L2 in a planar shape.

When, for example, the inductors L1, L2 are shown in plan view as shown in FIG. 4, the inductors L1, L2 may be provided concentrically. When, for example, the inductors L1, L2 are shown in plan view as shown in FIG. 5, at least part of the inductor L1 and at least part of the inductor L2 may overlap each other. Alternatively, when the inductors L1, L2 are shown in plan view as shown in FIG. 6, the inductors L1, L2 do not need to overlap each other.

For example, one or more switches may include a switch connected to an inner-side conductor in at least one inductor (here, the inductor L1) and a switch connected to an outer-side conductor in the at least one inductor.

With this configuration, it is possible to easily change the mutual inductance M by changing inductance components to be enabled, of the inductance components in the at least one inductor, between the inner side portion and the outer side portion.

Modification of First Embodiment

The connection mode of component elements connected to the gate of the transistor Tr1 is not limited to the one shown in FIG. 1; in other words, a second inductor magnetically coupled to the inductor L1 is not limited to the inductor L2. This will be described with reference to FIG. 9 as a modification of the first embodiment.

Figure 9:
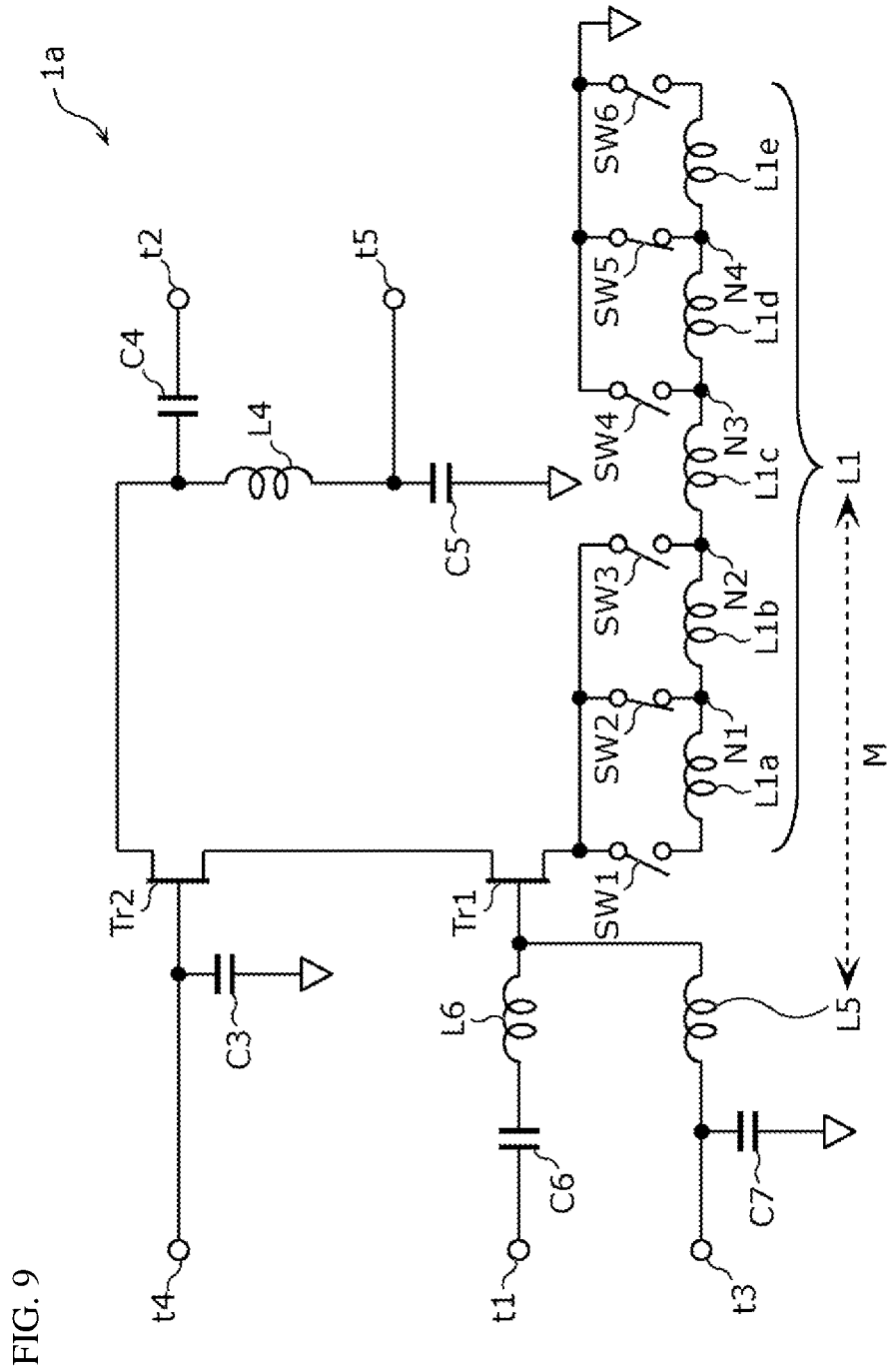
FIG. 9 is a circuit configuration diagram showing an example of an amplifier circuit according to a modification of the first embodiment.

FIG. 9 is a circuit configuration diagram showing an example of an amplifier circuit 1a according to the modification of the first embodiment.

The amplifier circuit 1a according to the modification of the first embodiment differs from the amplifier circuit 1 according to the first embodiment in the connection mode of component elements connected to the gate of the transistor Tr1, and the other portions are the same as those in the first embodiment. For this reason, in the modification of the first embodiment, the different portion will be described, and the description of the other portions is omitted.

The gate of the transistor Tr1 is connected to the input terminal t1 via an inductor L6 and a capacitor C6. The gate of the transistor Tr1 is connected to the bias terminal t3 via an inductor L5. The gate of the transistor Tr1 is connected to a ground via the inductor L5 and a capacitor C7.

The inductor L5 is a second inductor connected between the ground and a node in a path connecting the gate of the transistor Tr1 and the input terminal t1. The inductor L5 makes up an input matching circuit for matching the input impedance of the transistor Tr1. The inductor L5 is connected to the bias terminal t3 and also functions as a bias circuit that adjusts a bias supplied to the transistor Tr1.

The inductor L6 is connected between the gate of the transistor Tr1 and the input terminal t1. Specifically, the inductor L6 is provided in the path connecting the gate of the transistor Tr1 and the input terminal t1. The inductor L6 makes up an input matching circuit for matching the input impedance of the transistor Tr1.

The capacitor C6 is provided in the path connecting the gate of the transistor Tr1 and the input terminal t1 and is connected in series with the inductor L6. The capacitor C6 functions as a DC cut capacitor that blocks a bias input to the bias terminal t3 from leaking to the input terminal t1.

The capacitor C7 is connected between the ground and a node in the path connecting the gate of the transistor Tr1 and the input terminal t1. The inductor L5 is inserted in series between the capacitor C7 and the gate of the transistor Tr1. The bias terminal t3 is connected to a node in a path connecting the inductor L5 and the capacitor C7. The capacitor C7 functions as a bypass capacitor and may make up at least part of an input matching circuit for matching the input impedance of the transistor Tr1.

In this way, the second inductor mainly magnetically coupled to the inductor L1 to contribute to negative feedback may be the inductor L5 connected between the ground and a node in the path connecting the gate of the transistor Tr1 and the input terminal t1. In other words, the second inductor may be a series inductor connected to the gate of the transistor Tr1 or may be a shunt inductor connected to the gate of the transistor Tr1.

Second Embodiment

Figure 10:
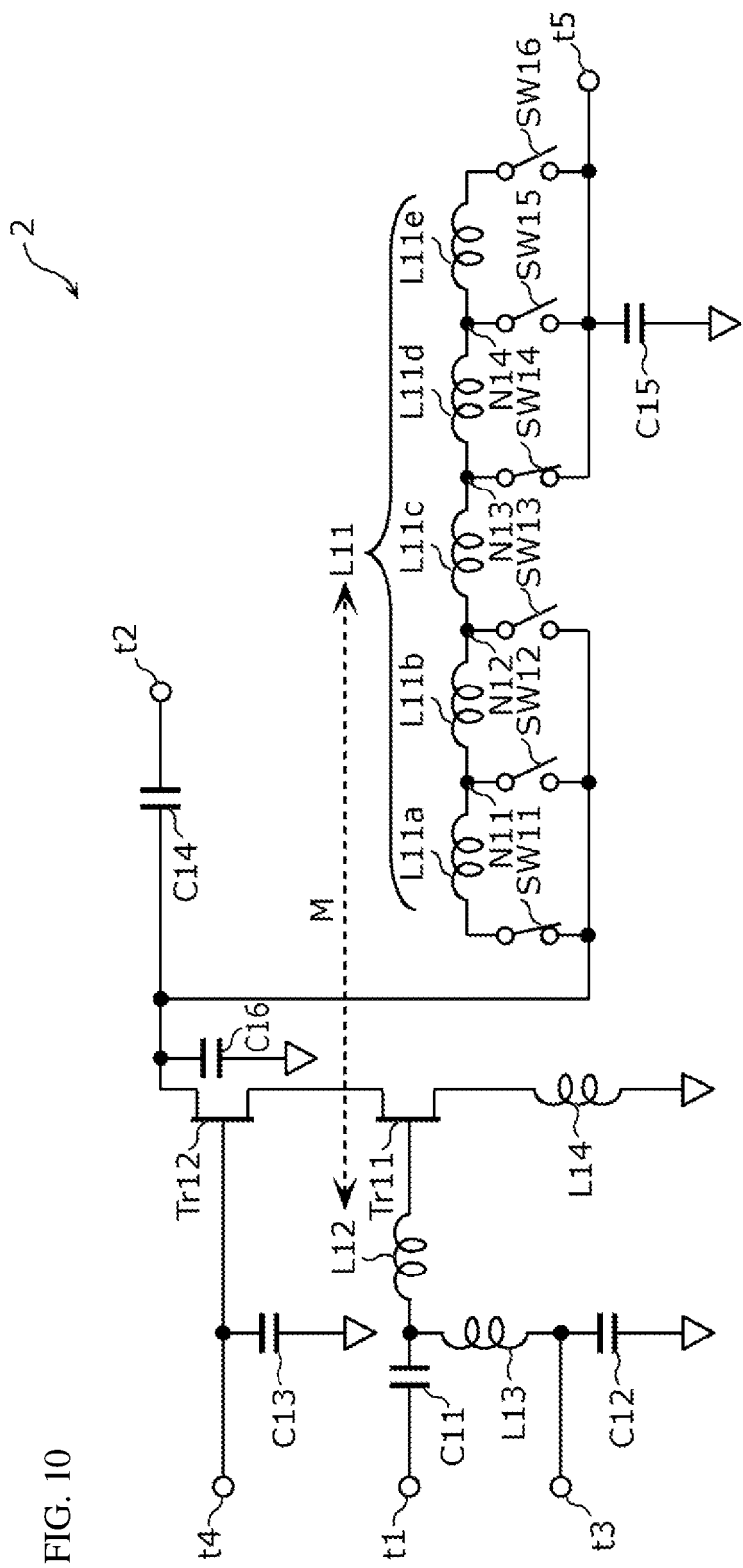
FIG. 10 is a circuit configuration diagram showing an example of an amplifier circuit according to a second embodiment.

FIG. 10 is a circuit configuration diagram showing an example of an amplifier circuit 2 according to a second embodiment.

The amplifier circuit 2 is a circuit that amplifies an input radio-frequency signal and that outputs the radio-frequency signal. An input terminal t1, an output terminal t2, and bias terminals t3, t4, t5 are connected to the amplifier circuit 2.

The amplifier circuit 2 includes transistors Tr11, Tr12, inductors L11, L12, L13, L14, capacitors C11, C12, C13, C14, C15, C16, and one or more switches. The amplifier circuit 2 includes, for example, switches SW11, SW12, SW13, SW14, SW15, SW16 as the one or more switches.

The transistors Tr11, Tr12 are provided between the input terminal t1 to which a radio-frequency signal is input and the output terminal t2 from which a radio-frequency signal is output. The transistor Tr11 is an example of the first transistor. The transistor Tr12 is an example of the second transistor. An amplifier is made up of the transistors Tr11, Tr12. The amplifier is, for example, an LNA. Alternatively, the amplifier may be a PA.

The transistor Tr11 has a first terminal that is a gate or a base, a second terminal that is a source or an emitter, and a third terminal that is a drain or a collector. The transistor Tr12 has a fourth terminal that is a gate or a base, a fifth terminal that is a source or an emitter, and a sixth terminal that is a drain or a collector.

The transistors Tr11, Tr12, each is, for example, a MOSFET. In this case, the first terminal and the fourth terminal are gates, the second terminal and the fifth terminal are sources, and the third terminal and the sixth terminal are drains.

The gate of the transistor Tr11 is connected to the input terminal t1. Specifically, the gate of the transistor Tr11 is connected to the input terminal t1 via the inductor L12 and the capacitor C1. The gate of the transistor Tr11 is connected to the bias terminal t3 via the inductors L12, L13. The gate of the transistor Tr1 is connected to a ground via the inductors L12, L13 and the capacitor C12. The source of the transistor Tr11 is connected to the ground. Specifically, the source of the transistor Tr11 is connected to the ground via the inductor L14. The drain of the transistor Tr11 is connected to the output terminal t2. Specifically, the drain of the transistor Tr11 is connected to the output terminal t2 via the transistor Tr12 and the capacitor C14.

The gate of the transistor Tr12 is connected to the bias terminal t4. The gate of the transistor Tr12 is connected to the ground via the capacitor C13. The source of the transistor Tr12 is connected to the drain of the transistor Tr1. The drain of the transistor Tr12 is connected to the output terminal t2 via the capacitor C14. The drain of the transistor Tr12 is connected to the ground via the capacitor C16. The drain of the transistor Tr12 is connected to the bias terminal t5 via the switches SW11, SW12, SW13, SW14, SW15, SW16 and the inductor L11. The drain of the transistor Tr12 is connected to the ground via the switches SW11, SW12, SW13, SW14, SW15, SW16, the inductor L11, and the capacitor C15.

The transistors Tr11, Tr12 are cascode-connected and make up a cascode amplifier.

The switches SW11, SW12, SW13, SW14, SW15, SW16 are connected to at least one of the inductors L11, L12. The switches SW11, SW12, SW13, SW14, SW15, SW16 are connected to, for example, the inductor L11. Each switch is switched between a conductive state and a nonconductive state based on, for example, a control signal from an outside source (for example, RFIC).

The inductor L11 is a first inductor connected between the drain of the transistor Tr11 and the output terminal t2. Specifically, the inductor L11 is connected between the ground and a node in a path connecting the drain of the transistor Tr12 and the output terminal t2. The inductor L11 makes up an output matching circuit for matching the output impedance of the transistor Tr12. The at least one inductor (here, the inductor L11) to which the switches SW11, SW12, SW13, SW14, SW15, SW16 are connected is provided with center taps that divide the inductance component of the inductor into multiple components. For example, the inductor L11 includes center taps N11, N12, N13, N14. The center taps N11, N12, N13, N14 divide the inductance component of the inductor L11 into inductance components L1a, L11b, L11c, L11d, L11e. The switches SW11, SW12, SW13, SW14, SW15, SW16 include switches connected to the center taps N11, N12, N13, N14. For example, the switch SW12 is connected to the center tap N11, the switch SW13 is connected to the center tap N12, the switch SW14 is connected to the center tap N13, and the switch SW15 is connected to the center tap N14. Of the inductance components of the inductor L11, inductance components to be enabled are changed by switching each of the switches SW11, SW12, SW13, SW14, SW15, SW16 between a conductive state and a nonconductive state. For example, as shown in FIG. 10, when the switches SW11, SW14 are set in a conductive state and the switches SW12, SW13, SW15, SW16 are set in a nonconductive state, the inductance components L1a, L11b, L11c of the inductance components of the inductor L11 are enabled.

The inductor L12 is a component element corresponding to the inductor L2 in the first embodiment, so the description thereof is omitted.

The inductor L13 is a component element corresponding to the inductor L3 in the first embodiment, so the description thereof is omitted.

The inductor L14 is connected between the source of the transistor Tr11 and the ground. The inductor L14 is a source degeneration inductor for improving the linearity of the transistor Tr11.

The capacitor C1 is a component element corresponding to the capacitor C1 in the first embodiment, so the description thereof is omitted.

The capacitor C12 is a component element corresponding to the capacitor C2 in the first embodiment, so the description thereof is omitted.

The capacitor C13 is a component element corresponding to the capacitor C3 in the first embodiment, so the description thereof is omitted.

The capacitor C14 is a component element corresponding to the capacitor C4 in the first embodiment, so the description thereof is omitted.

The capacitor C15 is connected between the ground and a node in the path connecting the drain of the transistor Tr12 and the output terminal t2 and is connected to the switches SW14, SW15, SW16. The capacitor C15 is connected to the bias terminal t5. The capacitor C15 also functions as a bypass capacitor.

The capacitor C16 is connected between the ground and a node in the path connecting the drain of the transistor Tr12 and the output terminal t2. The capacitor C16 makes up an output matching circuit for matching the output impedance of the transistor Tr12.

It is possible to adjust the frequency band of a radio-frequency signal to be amplified by the amplifier by adjusting parameters of the matching circuits.

The inductor L11 and the inductor L12 are magnetically coupled, and magnetic coupling of the inductor L11 and the inductor L12 are schematically represented by the dashed arrow in FIG. 10. A mutual inductance of the inductor L11 and the inductor L12 is denoted by "M". When the inductors L11, L12 are magnetically coupled, parameters of the inductors L11, L12 are adjusted such that negative feedback is applied in a specific frequency band.

The mutual inductance M of the inductor L11 and the inductor L12 is changed by switching each of the switches SW11, SW12, SW13, SW14, SW15, SW16 between a conductive state and a nonconductive state. A method of changing the mutual inductance M is the same as the method described in the first embodiment, so the detailed description thereof is omitted. For example, the shapes of the inductors L1, L2, shown in FIG. 4, FIG. 5, and FIG. 6, may be applied to the inductors L11, L12.

The transistors Tr11, Tr12 may be, for example, bipolar transistors. In this case, the first terminal and the fourth terminal are bases, the second terminal and the fifth terminal are emitters, and the third terminal and the sixth terminal are collectors. In the above description and the following description, gates may be replaced with bases, sources may be replaced with emitters, and drains may be replaced with collectors.

Advantageous Effects and the Like of Second Embodiment

The amplifier circuit 2 includes: the transistor Tr11 provided between the input terminal t1 to which a radio-frequency signal is input and the output terminal t2 from which a radio-frequency signal is output and having the first terminal that is a gate or a base connected to the input terminal t1, the second terminal that is a source or an emitter connected to the ground, and the third terminal that is a drain or a collector connected to the output terminal t2; the inductor L11 connected between the third terminal and the output terminal, the inductor L12 connected between the first terminal and the input terminal t1; and one or more switches connected to at least one of the inductor L11 and the inductor L12 and configured to change the mutual inductance M of the inductor L11 and the inductor L12.

In this way, the inductor L11 (first inductor) magnetically coupled to the inductor L12 (second inductor) may be an inductor connected to the drain of the transistor Tr1 (first transistor), and, in this case as well, it is possible to obtain a gain according to the strength of an input radio-frequency signal while suppressing occurrence of a distortion.

For example, the amplifier circuit 2 may include the transistor Tr12 having the fourth terminal that is a gate or a base, the fifth terminal that is a source or an emitter connected to the third terminal, and the sixth terminal that is a drain or a collector connected to the output terminal t2, and the third terminal may be connected to the output terminal t2 via the transistor Tr12, and the inductor L11 may be connected between the sixth terminal and the output terminal t2.

With this configuration, a gain tends to decrease by the amount by which negative feedback of a radio-frequency signal is performed by the magnetically coupled inductors L11, L12; however, Miller effect is suppressed by the cascode amplifier made up of the transistors Tr11, Tr12 to make it easy to maintain a gain even at radio frequencies, so it is possible to make allowance for a gain.

In the description of the advantageous effects and the like in the first embodiment, the inductors L1, L2 may be replaced with the inductors L11, L12 as needed.

First Modification of Second Embodiment

The connection mode of component elements connected to the gate of the transistor Tr11 is not limited to the one shown in FIG. 10; in other words, a second inductor magnetically coupled to the inductor L11 is not limited to the inductor L12. This will be described with reference to FIG. 11 as a first modification of the second embodiment.

Figure 11:
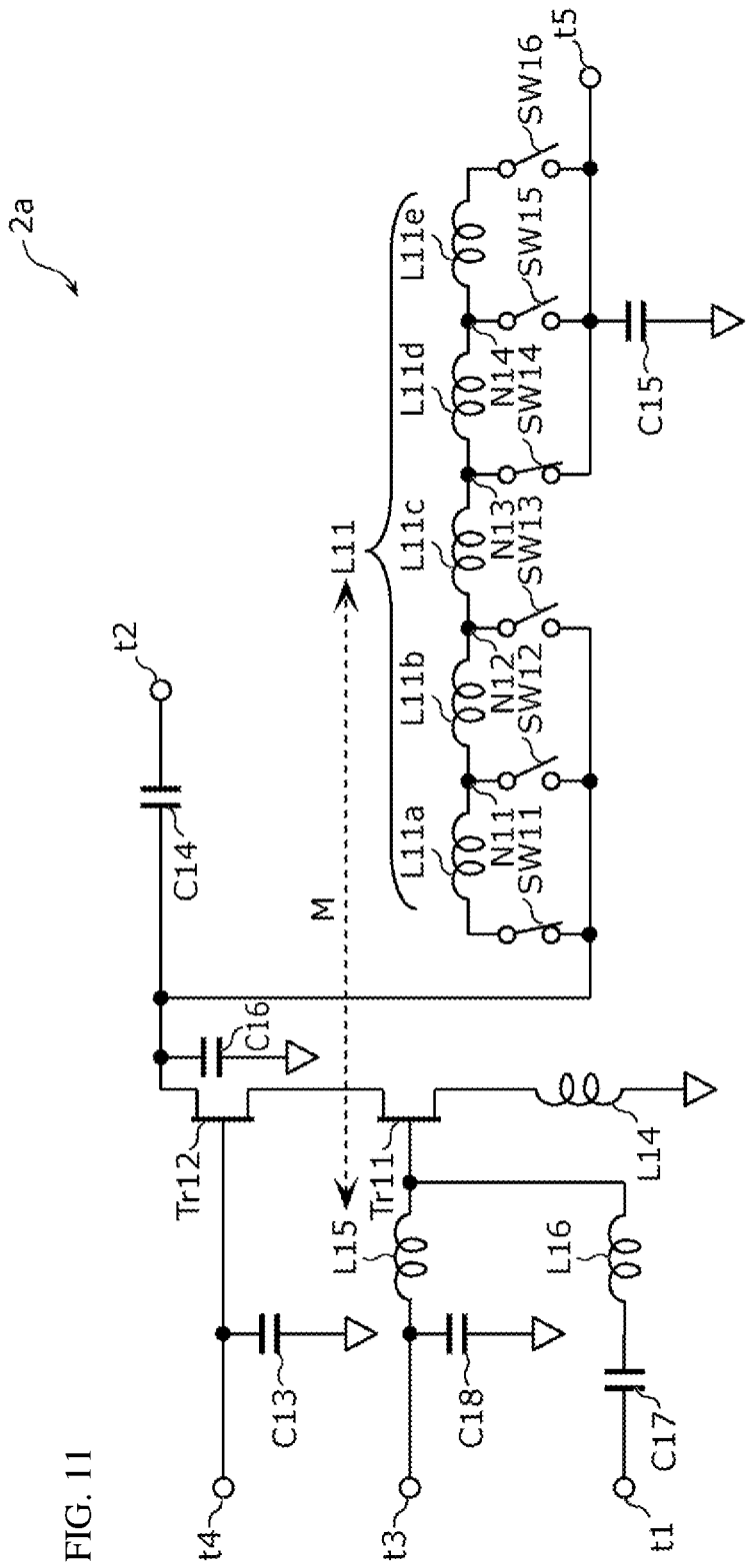
FIG. 11 is a circuit configuration diagram showing an example of an amplifier circuit according to a first modification of the second embodiment.

FIG. 11 is a circuit configuration diagram showing an example of an amplifier circuit 2a according to the first modification of the second embodiment.

The amplifier circuit 2a according to the first modification of the second embodiment differs from the amplifier circuit 2 according to the second embodiment in the connection mode of component elements connected to the gate of the transistor Tr1, and the other portions are the same as those in the second embodiment. For this reason, in the first modification of the second embodiment, the different portion will be described, and the description of the other portions is omitted.

The gate of the transistor Tr11 is connected to the input terminal t1 via an inductor L16 and a capacitor C17. The gate of the transistor Tr11 is connected to the bias terminal t3 via an inductor L15. The gate of the transistor Tr11 is connected to a ground via the inductor L15 and a capacitor C18.

The inductor L15 is a second inductor connected between the ground and a node in a path connecting the gate of the transistor Tr11 and the input terminal t1. The inductor L15 makes up an input matching circuit for matching the input impedance of the transistor Tr1. The inductor L15 is connected to the bias terminal t3 and also functions as a bias circuit that adjusts a bias supplied to the transistor Tr11.

The inductor L16 is provided in the path connecting the gate of the transistor Tr1 and the input terminal t1. The inductor L16 makes up an input matching circuit for matching the input impedance of the transistor Tr11.

The capacitor C17 is provided in the path connecting the gate of the transistor Tr1 and the input terminal t1 and is connected in series with the inductor L16. The capacitor C17 functions as a DC cut capacitor that blocks a bias input to the bias terminal t3 from leaking to the input terminal t1.

The capacitor C18 is connected between the ground and a node in the path connecting the gate of the transistor Tr11 and the input terminal t1. The inductor L15 is inserted in series between the capacitor C18 and the gate of the transistor Tr11. The bias terminal t3 is connected to a node in a path connecting the inductor L15 and the capacitor C18. The capacitor C18 functions as a bypass capacitor and may make up at least part of an input matching circuit for matching the input impedance of the transistor Tr11.

In this way, the second inductor mainly magnetically coupled to the inductor L11 to contribute to negative feedback may be the inductor L15 connected between the ground and a node in the path connecting the gate of the transistor Tr11 and the input terminal t1. In other words, the second inductor may be a series inductor connected to the gate of the transistor Tr11 or may be a shunt inductor connected to the gate of the transistor Tr11.

Second Modification of Second Embodiment

The inductor L11 and the switches SW11, SW12, SW13, SW14, SW15, SW16 may be provided in a path connecting the drain of the transistor Tr11 and the output terminal t2. This will be described with reference to FIG. 12 as a second modification of the second embodiment.

Figure 12:
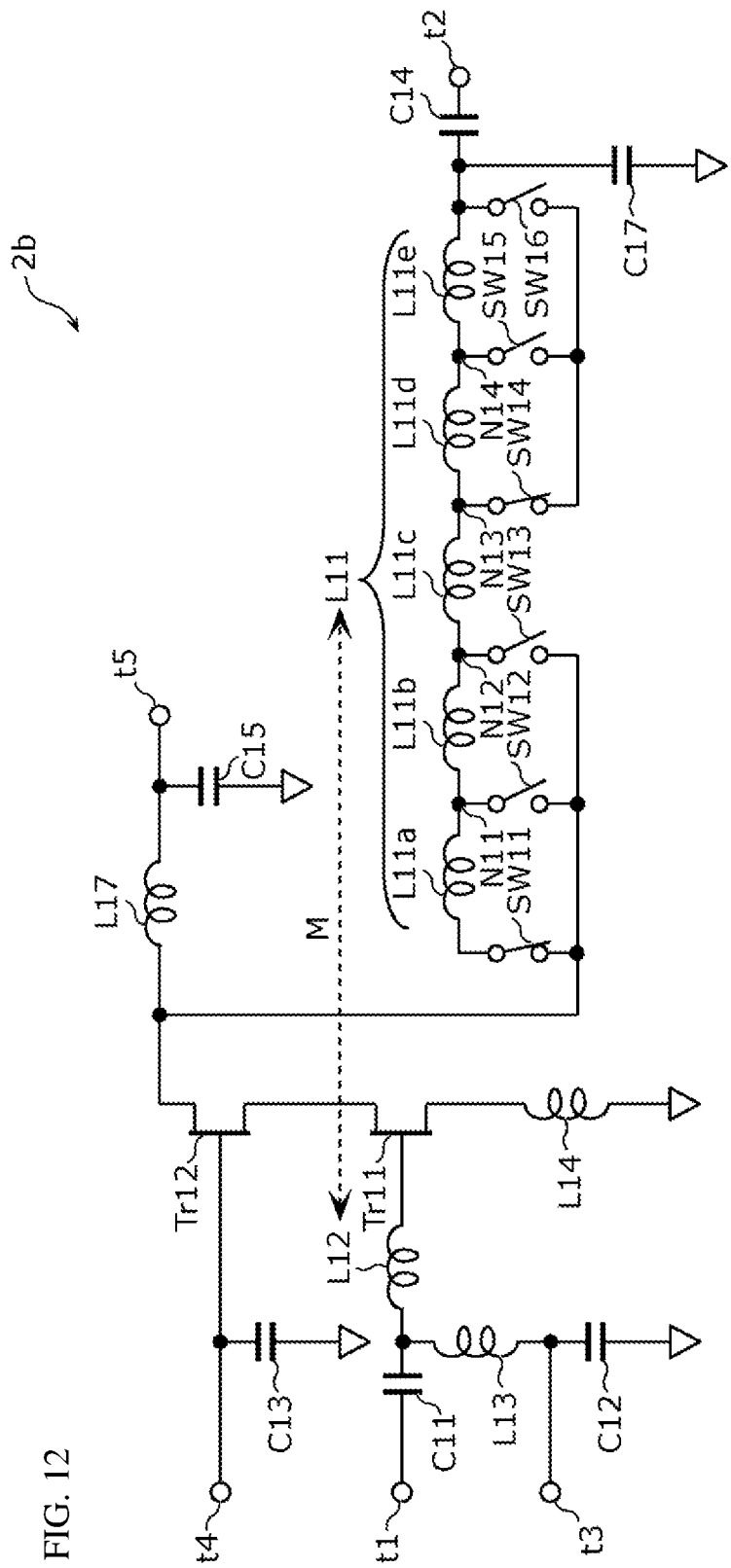
FIG. 12 is a circuit configuration diagram showing an example of an amplifier circuit according to a second modification of the second embodiment.

FIG. 12 is a circuit configuration diagram showing an example of an amplifier circuit 2b according to the second modification of the second embodiment.

The amplifier circuit 2b according to the second modification of the second embodiment differs from the amplifier circuit 2 according to the second embodiment in the connection mode of component elements connected to the drain of the transistor Tr12, and the other portions are the same as those in the second embodiment. For this reason, in the second modification of the second embodiment, the different portion will be described, and the description of the other portions is omitted.

The drain of the transistor Tr12 is connected to the output terminal t2 via the switches SW11, SW12, SW13, SW14, SW15, SW16, the inductor L11, and the capacitor C14. The drain of the transistor Tr12 is connected to the ground via the switches SW11, SW12, SW13, SW14, SW15, SW16, the inductor L11, and the capacitor C17. The drain of the transistor Tr12 is connected to the bias terminal t5 via an inductor L17. The drain of the transistor Tr12 is connected to the ground via the inductor L17 and the capacitor C15.

The inductor L11 is a first inductor connected between the drain of the transistor Tr11 and the output terminal t2. Specifically, the inductor L11 is provided in a path connecting the drain of the transistor Tr12 and the output terminal t2. The inductor L11 is connected in series with the capacitor C14.

The capacitor C14 functions as a DC cut capacitor that blocks a bias input to the bias terminal t5 from leaking to the output terminal t2 and may make up at least part of an output matching circuit for matching the output impedance of the transistor Tr12.

The inductor L17 is connected between the ground and a node in the path connecting the drain of the transistor Tr12 and the output terminal t2 and is connected in series with the capacitor C15. The inductor L17 is a choke coil for supplying a bias.

The capacitor C15 is connected between the ground and a node in a path connecting the drain of the transistor Tr12 and the bias terminal t5 and is connected in series with the inductor L17.

The capacitor C17 is connected between the ground and a node in the path connecting the drain of the transistor Tr12 and the output terminal t2. The capacitor C17 makes up an output matching circuit for matching the output impedance of the transistor Tr12.

In this way, the inductor L11 that is a first inductor may be an inductor provided in the path connecting the drain of the transistor Tr11 (here, the drain of the transistor Tr12) and the output terminal t2. In other words, the first inductor may be a shunt inductor connected between the ground and a node in the path connecting the drain of the transistor Tr11 and the output terminal t2 as in the case of the second embodiment and the first modification of the second embodiment, or may be a series inductor provided in the path connecting the drain of the transistor Tr1 and the output terminal t2 as in the case of the second modification of the second embodiment.

Third Embodiment

Figure 13:
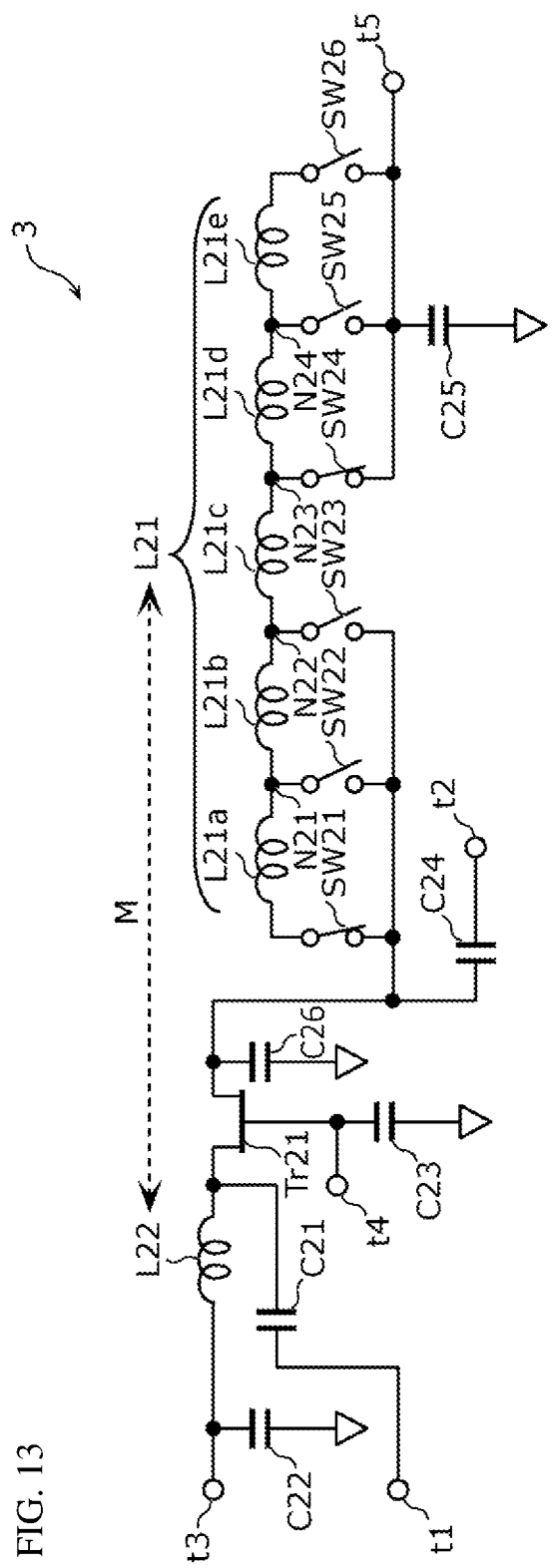
FIG. 13 is a circuit configuration diagram showing an example of an amplifier circuit according to a third embodiment.

FIG. 13 is a circuit configuration diagram showing an example of an amplifier circuit 3 according to a third embodiment.

The amplifier circuit 3 is a circuit that amplifies an input radio-frequency signal and that outputs the radio-frequency signal. An input terminal t1, an output terminal t2, and bias terminals t3, t4, t5 are connected to the amplifier circuit 3.

The amplifier circuit 3 includes a transistor Tr21, inductors L21, L22, capacitors C21, C22, C23, C24, C25, C26, and one or more switches. The amplifier circuit 3 includes, for example, switches SW21, SW22, SW23, SW24, SW25, SW26 as the one or more switches.

The transistor Tr21 is provided between the input terminal t1 to which a radio-frequency signal is input and the output terminal t2 from which a radio-frequency signal is output. The transistor Tr21 is an example of the first transistor. An amplifier is made up of the transistor Tr21. The amplifier is, for example, an LNA. Alternatively, the amplifier may be a PA.

The transistor Tr21 has a first terminal that is a gate or a base, a second terminal that is a source or an emitter, and a third terminal that is a drain or a collector.

The transistor Tr21 is, for example, a MOSFET. In this case, the first terminal is a gate, the second terminal is a source, and the third terminal is a drain.

The gate of the transistor Tr21 is connected to the bias terminal t4. The gate of the transistor Tr21 is connected to a ground via the capacitor C23. The source of the transistor Tr21 is connected to one of the input terminal t1 and the output terminal t2. For example, the source of the transistor Tr21 is connected to the input terminal t1. Specifically, the source of the transistor Tr21 is connected to the input terminal t1 via the capacitor C21. The source of the transistor Tr21 is connected to the bias terminal t3 via the inductor L22. The source of the transistor T21 is connected to the ground via the inductor L22 and the capacitor C22. The drain of the transistor Tr21 is connected to the other one of the input terminal t1 and the output terminal t2. For example, the drain of the transistor Tr21 is connected to the output terminal t2. Specifically, the drain of the transistor Tr21 is connected to the output terminal t2 via the capacitor C24. The drain of the transistor Tr21 is connected to the ground via the capacitor C26. The drain of the transistor Tr21 is connected to the bias terminal t5 via the switches SW21, SW22, SW23, SW24, SW25, SW26 and the inductor L21. The drain of the transistor Tr21 is connected to the ground via the switches SW21, SW22, SW23, SW24, SW25, SW26, the inductor L21, and the capacitor C25.

The switches SW21, SW22, SW23, SW24, SW25, SW26 are connected to at least one of the inductors L21, L22. The switches SW21, SW22, SW23, SW24, SW25, SW26 are connected to, for example, the inductor L21. Each switch is switched between a conductive state and a nonconductive state based on, for example, a control signal from an outside source (for example, RFIC).

The inductor L21 is a first inductor connected between the drain of the transistor Tr21 and the output terminal t2. Specifically, the inductor L21 is connected between the ground and a node in a path connecting the drain of the transistor Tr21 and the output terminal t2. The inductor L21 makes up an output matching circuit for matching the output impedance of the transistor Tr21. The at least one inductor (here, the inductor L21) to which the switches SW21, SW22, SW23, SW24, SW25, SW26 are connected is provided with center taps that divide the inductance component of the inductor into multiple components. For example, the inductor L21 includes center taps N21, N22, N23, N24. The center taps N21, N22, N23, N24 divide the inductance component of the inductor L21 into inductance components L21a, L21b, L21c, L21d, L21e. The switches SW21, SW22, SW23, SW24, SW25, SW26 include switches connected to the center taps N21, N22, N23, N24. For example, the switch SW22 is connected to the center tap N21, the switch SW23 is connected to the center tap N22, the switch SW24 is connected to the center tap N23, and the switch SW25 is connected to the center tap N24. Of the inductance components of the inductor L21, inductance components to be enabled are changed by switching each of the switches SW21, SW22, SW23, SW24, SW25, SW26 between a conductive state and a nonconductive state. For example, as shown in FIG. 13, when the switches SW21, SW24 are set in a conductive state and the switches SW22, SW23, SW25, SW26 are set in a nonconductive state, the inductance components L21a, L21b, L21c of the inductance components of the inductor L21 are enabled.

The inductor L22 is a second inductor connected between the source of the transistor Tr21 and the input terminal t1. Specifically, the inductor L22 is connected between the ground and a node in a path connecting the source of the transistor Tr21 and the input terminal t1. The inductor L22 is connected to the bias terminal t3 and also functions as part of a bias circuit as a choke coil that supplies a bias supplied to the transistor Tr21. The inductor L22 makes up an input matching circuit for matching the input impedance of the transistor Tr21.

The capacitor C21 is provided in a path connecting the source of the transistor Tr21 and the input terminal t1. The capacitor C21 functions as a DC cut capacitor that blocks a bias input to the bias terminal t3 from leaking to the input terminal t1.

The capacitor C22 is connected between the ground and a node in the path connecting the source of the transistor Tr21 and the input terminal t1. The inductor L22 is inserted in series between the capacitor C22 and the source of the transistor Tr21. The bias terminal t3 is connected to a node in a path connecting the inductor L22 and the capacitor C22. The capacitor C22 functions as a bypass capacitor and may make up at least part of an input matching circuit for matching the input impedance of the transistor Tr21.

The capacitor C23 is a bypass capacitor connected between the ground and a node in a path connecting the gate of the transistor Tr21 and the bias terminal t4.

The capacitor C24 is provided in the path connecting the drain of the transistor Tr21 and the output terminal t2. The capacitor C24 makes up an output matching circuit for matching the output impedance of the transistor Tr21. The capacitor C24 also functions as a DC cut capacitor that blocks a bias input to the bias terminal t5 from leaking to the output terminal t2.

The capacitor C25 is connected between the ground and a node in the path connecting the drain of the transistor Tr21 and the output terminal t2 and is connected to the switches SW24, SW25, SW26. The capacitor C25 is connected to the bias terminal t5. The capacitor C25 makes up an output matching circuit for matching the output impedance of the transistor Tr21. The capacitor C25 also functions as a bypass capacitor.

The capacitor C26 is connected between the ground and a node in the path connecting the drain of the transistor Tr21 and the output terminal t2. The capacitor C26 makes up an output matching circuit for matching the output impedance of the transistor Tr21. The capacitor C26 also functions as a bypass capacitor.

It is possible to adjust the frequency band of a radio-frequency signal to be amplified by the amplifier by adjusting parameters of the matching circuits.

The inductor L21 and the inductor L22 are magnetically coupled, and magnetic coupling of the inductor L21 and the inductor L22 are schematically represented by the dashed arrow in FIG. 13. A mutual inductance of the inductor L21 and the inductor L22 is denoted by "M". When the inductors L21, L22 are magnetically coupled, parameters of the inductors L21, L22 are adjusted such that negative feedback is applied in a specific frequency band.

The mutual inductance M of the inductor L21 and the inductor L22 is changed by switching each of the switches SW21, SW22, SW23, SW24, SW25, SW26 between a conductive state and a nonconductive state. A method of changing the mutual inductance M is the same as the method described in the first embodiment, so the detailed description thereof is omitted. For example, the shapes of the inductors L1, L2, shown in FIG. 4, FIG. 5, and FIG. 6, may be applied to the inductors L21, L22.

The transistor Tr21 may be, for example, a bipolar transistor. In this case, the first terminal is a base, the second terminal is an emitter, and the third terminal is a collector. In the above description and the following description, a gate may be replaced with a base, a source may be replaced with an emitter, and a drain may be replaced with a collector.

Advantageous Effects and the Like of Third Embodiment

The amplifier circuit 3 includes: the transistor Tr21 provided between the input terminal t1 to which a radio-frequency signal is input and the output terminal t2 from which a radio-frequency signal is output and having the first terminal that is a gate or a base connected to a ground, the second terminal that is a source or an emitter connected to one of the input terminal t1 and the output terminal t2, and the third terminal that is a drain or a collector connected to the other one of the input terminal t1 and the output terminal t2; the inductor L21 connected between the third terminal and the other one of the input terminal t1 and the output terminal t2, the inductor L22 connected between the second terminal and the one of the input terminal t1 and the output terminal t2; and one or more switches connected to at least one of the inductors L21, L22 and configured to change the mutual inductance M of the inductor L21 and the inductor L22.

In this way, the magnetically coupled inductor L21 (first inductor) and inductor L22 (second inductor) may be an inductor connected to the drain of the transistor Tr21 (first transistor) and an inductor connected to the source of the transistor Tr21 (first transistor), and, in this case as well, it is possible to obtain a gain according to the strength of an input radio-frequency signal while suppressing occurrence of a distortion.

In the description of the advantageous effects and the like in the first embodiment, the inductors L1, L2 may be replaced with the inductors L21, L22 as needed.

For example, at least one inductor (for example, the inductor L21) may be an inductor connected to the output terminal t2.

When, for example, one or more switches are connected to the inductor L22 connected to the input terminal t1, the equivalent series resistance of the inductor L22 increases, and the NF of the amplifier degrades. In contrast, when one or more switches are connected to not the inductor L22 connected to the input terminal t1 but the inductor L21 connected to the output terminal t2, it is possible to suppress degradation of NF.

Modification of Third Embodiment

The inductor L21 and the switches SW21, SW22, SW23, SW24, SW25, SW26 may be provided in a path connecting the drain of the transistor Tr21 and the output terminal t2. This will be described with reference to FIG. 14 as a modification of the third embodiment.

Figure 14:
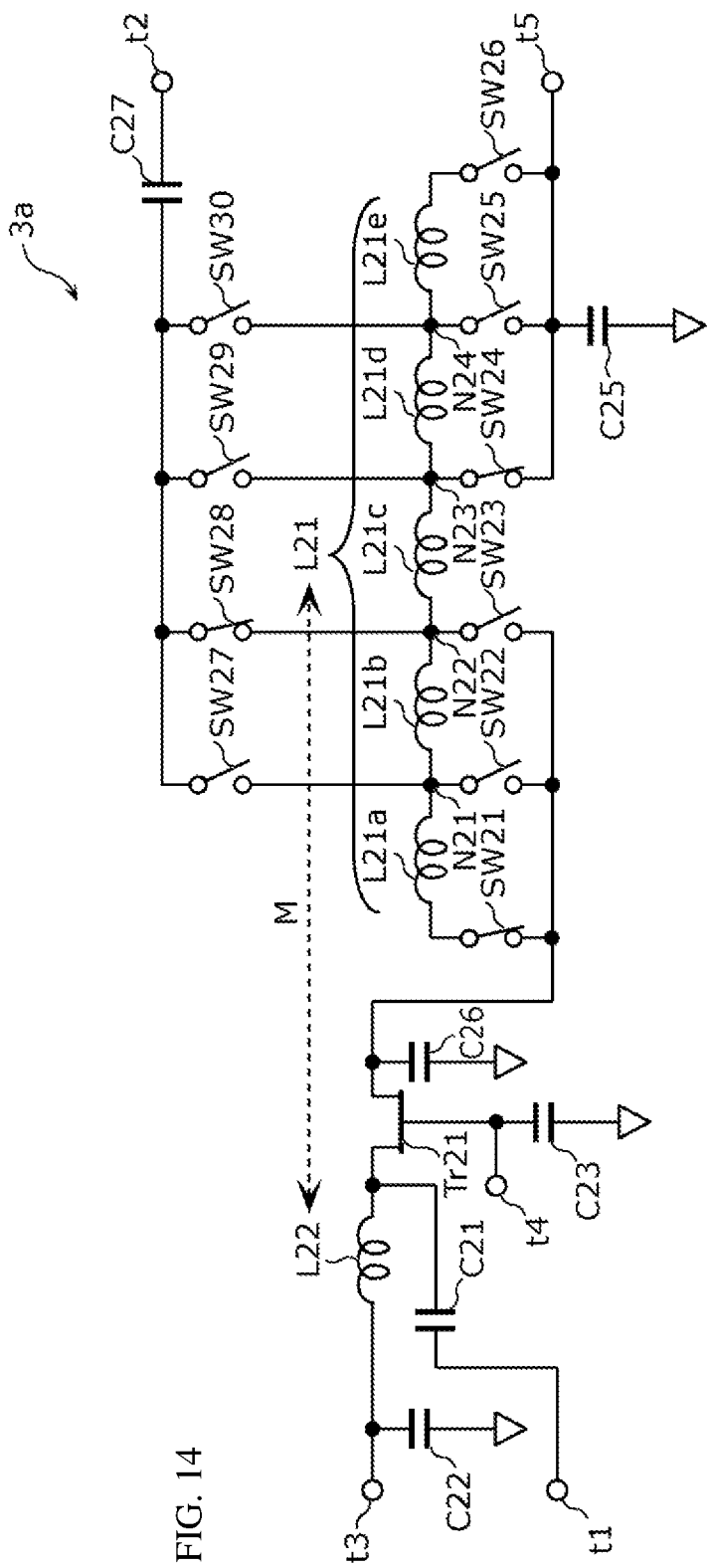
FIG. 14 is a circuit configuration diagram showing an example of an amplifier circuit according to a modification of the third embodiment.

FIG. 14 is a circuit configuration diagram showing an example of an amplifier circuit 3a according to the modification of the third embodiment.

The amplifier circuit 3a according to the modification of the third embodiment differs from the amplifier circuit 3 according to the third embodiment in the number of component elements and the connection mode of the component elements connected to the drain of the transistor Tr21, and the other portions are the same as those in the third embodiment. For this reason, in the modification of the third embodiment, the different portion will be described, and the description of the other portions is omitted.

The amplifier circuit 3a further includes switches SW27, SW28, SW29, SW30 in addition to the amplifier circuit 3. Each of the switches SW27, SW28, SW29, SW30 is switched between a conductive state and a nonconductive state based on, for example, a control signal from an outside source (for example, RFIC).

The drain of the transistor Tr21 is connected to the output terminal t2 via the switches SW21, SW22, SW23, the inductor L21, the switches SW27, SW28, SW29, SW30, and a capacitor C27.

The switch SW27 is connected to the center tap N21, the switch SW28 is connected to the center tap N22, the switch SW29 is connected to the center tap N23, and the switch SW30 is connected to the center tap N24. Of the inductance components of the inductor L21, components used as series inductors and components used as shunt inductors between the drain of the transistor Tr21 and the output terminal t2 can be changed by switching each of the switches SW27, SW28, SW29, SW30 between a conductive state and a nonconductive state. With this configuration, it is possible to adjust the output impedance of the transistor Tr21 depending on a situation.

The capacitor C27 is provided in the path connecting the drain of the transistor Tr21 and the output terminal t2. The capacitor C27 makes up an output matching circuit for matching the output impedance of the transistor Tr21. The capacitor C27 also functions as a DC cut capacitor that blocks a bias input to the bias terminal t5 from leaking to the output terminal t2.

In this way, the inductor L21 may be provided in the path connecting the drain of the transistor Tr21 and the output terminal t2. A switch may be provided between the output terminal t2 and a center tap provided in the inductor L21, and the output impedance of the transistor Tr21 may be adjusted by switching the switch.

Other Embodiments

The amplifier circuit according to embodiments of the present disclosure is described by way of the embodiments; however, the present disclosure is not limited to the above-described embodiments. The present disclosure also encompasses other embodiments implemented by combining selected components of the above-described embodiments, modifications obtained by applying various alterations that are conceived of by persons skilled in the art to the above-described embodiments without necessarily departing from the purport of the present disclosure, and various devices that include the amplifier circuit according to embodiments of the present disclosure.

For example, a center tap does not need to be provided in at least one of the inductors (for example, first inductor), connected to one or more switches. For example, an amplifier circuit may include a plurality of first inductors. Each of the plurality of first inductors may have a different distance from a second inductor, may have a different overlapping area with the second inductor, or a different permeability with the second inductor. Then, each of the one or more (for example, a plurality of) switches and each of the plurality of first inductors may be connected in a one-to-one correspondence, and a mutual inductance M may be changed by selecting a switch to be set in a conductive state from among the plurality of switches, that is, selecting a first inductor to be connected to a first transistor from among the plurality of first inductors.

For example, in the above-described embodiments, a plurality of single pole single throw (SPST) switches is illustrated as one or more switches. Alternatively, one or more switches may be m (m is an integer greater than or equal to one) pole n (n is an integer greater than or equal to two) throw (mPnT) switches.

For example, in the above-described embodiments, six switches are illustrated as one or more switches. Alternatively, one or more switches may be one switch.

For example, a first inductor and a second inductor may be disposed so as to overlap each other, in other words, so as to interdigitate each other, further in other words, so as to interleave each other.

For example, in the first embodiment and the second embodiment, an example in which the amplifier is a cascode amplifier is described; however, the amplifier does not need to be a cascode amplifier. In other words, in the first embodiment, the amplifier circuit 1 does not need to include the transistor Tr2, and, in the second embodiment, the amplifier circuit 2 does not need to include the transistor Tr12.

INDUSTRIAL APPLICABILITY

Embodiments of the present disclosure are widely usable in communication equipment, such as cellular phones, as amplifier circuits that amplify radio-frequency signals.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. An amplifier circuit comprising:
a first transistor between an input terminal to which a radio-frequency signal is input and an output terminal from which an amplified radio-frequency signal is output, the first transistor having a first terminal that is a gate or a base connected to the input terminal, a second terminal that is a source or an emitter connected to ground, and a third terminal that is a drain or a collector connected to the output terminal;
a first inductor connected between the second terminal and ground;
a second inductor connected between the first terminal and the input terminal; and
one or more switches, each of the switches being connected to the first inductor or the second inductor, and the one or more switches being configured to selectively change a mutual inductance between the first inductor and the second inductor, wherein at least one of the switches is connected to the first inductor.

2. The amplifier circuit according to claim 1, further comprising:
a second transistor having a fourth terminal that is a gate or a base, a fifth terminal that is a source or an emitter connected to the third terminal of the first transistor, and a sixth terminal that is a drain or a collector connected to the output terminal,
wherein the third terminal of the first transistor is connected to the output terminal via the second transistor.

3. An amplifier circuit comprising:
a first transistor between an input terminal to which a radio-frequency signal is input and an output terminal from which an amplified radio-frequency signal is output, the first transistor having a first terminal that is a gate or a base connected to the input terminal, a second terminal that is a source or an emitter connected to ground, and a third terminal that is a drain or a collector connected to the output terminal;
a first inductor connected between the third terminal and the output terminal;
a second inductor connected between the first terminal and the input terminal; and
one or more switches, each of the switches being connected to the first inductor or the second inductor, and the one or more switches being configured to selectively change a distance between the first inductor and the second inductor, an overlapping area between the first inductor and the second inductor, or a permeability between the first inductor and the second inductor.

4. The amplifier circuit according to claim 3, further comprising:
a second transistor having a fourth terminal that is a gate or a base, a fifth terminal that is a source or an emitter connected to the third terminal of the first transistor, and a sixth terminal that is a drain or a collector connected to the output terminal, wherein:
the third terminal of the first transistor is connected to the output terminal via the second transistor; and
the first inductor is connected between the sixth terminal of the second transistor and the output terminal.

5. The amplifier circuit according to claim 3, wherein at least one of the switches is connected to the first inductor.

6. An amplifier circuit comprising:
- a first transistor between an input terminal to which a radio-frequency signal is input and an output terminal from which an amplified radio-frequency signal is output, the first transistor having a first terminal that is a gate or a base connected to ground, a second terminal that is a source or an emitter connected to one of the input terminal or the output terminal, and a third terminal that is a drain or a collector connected to the other one of the input terminal or the output terminal;
- a first inductor connected between the third terminal and the other one of the input terminal or the output terminal;
- a second inductor connected between the second terminal and the one of the input terminal or the output terminal; and
- one or more switches, each of the switches being connected to the first inductor or the second inductor,
- wherein the first inductor or the second inductor includes a center tap that divides an inductance component of the first inductor or the second inductor into multiple components, and
- wherein at least one of the switches is connected to the center tap.

7. The amplifier circuit according to claim 6, wherein the inductor having the center tap is connected to the output terminal.

8. The amplifier circuit according to claim 1, wherein the one or more switches are configured to change the mutual inductance in accordance with a strength of a radio-frequency signal input to the input terminal.

9. The amplifier circuit according to claim 1, wherein the one or more switches are configured to change the mutual inductance while maintaining a self-inductance of the first inductor.

10. The amplifier circuit according to claim 1, wherein when the first inductor and the second inductor are shown in a plan view, the first inductor and the second inductor are spiral inductors.

11. The amplifier circuit according to claim 6, wherein when the first inductor and the second inductor are shown in a plan view, the first inductor and the second inductor are spiral inductors.

12. The amplifier circuit according to claim 10, wherein when the first inductor and the second inductor are shown in the plan view, the first inductor and the second inductor are concentric.

13. The amplifier circuit according to claim 11, wherein when the first inductor and the second inductor are shown in the plan view, the first inductor and the second inductor are concentric.

14. The amplifier circuit according to claim 10, wherein when the first inductor and the second inductor are shown in the plan view, at least part of the first inductor overlaps at least part of the second inductor.

15. The amplifier circuit according to claim 11, wherein when the first inductor and the second inductor are shown in the plan view, at least part of the first inductor overlaps at least part of the second inductor.

16. The amplifier circuit according to claim 10, wherein when the first inductor and the second inductor are shown in the plan view, the first inductor and the second inductor do not overlap each other.

17. The amplifier circuit according to claim 11, wherein when the first inductor and the second inductor are shown in the plan view, the first inductor and the second inductor do not overlap each other.

18. The amplifier circuit according to claim 10, wherein at least one of the switches is connected to an inner-side conductor of the first inductor, and at least one of the switches is connected to an outer-side conductor of the first inductor.

19. The amplifier circuit according to claim 11, wherein at least one of the switches is connected to an inner-side conductor of the first inductor or the second inductor, and at least one of the switches is connected to an outer-side conductor of the first inductor or the second inductor.

* * * * *